(12) United States Patent
Kon

(10) Patent No.: US 8,557,144 B2
(45) Date of Patent: Oct. 15, 2013

(54) MATERIAL FOR FORMING CONDUCTIVE ANTIREFLECTION FILM, METHOD FOR FORMING CONDUCTIVE ANTIREFLECTION FILM, METHOD FOR FORMING RESIST PATTERN, SEMICONDUCTOR DEVICE, AND MAGNETIC HEAD

(75) Inventor: Junichi Kon, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 42 days.

(21) Appl. No.: 12/560,866

(22) Filed: Sep. 16, 2009

(65) Prior Publication Data

US 2010/0009296 A1 Jan. 14, 2010

Related U.S. Application Data

(63) Continuation of application No. PCT/JP2007/055665, filed on Mar. 20, 2007.

(51) Int. Cl.
*G03F 7/20* (2006.01)
*G03F 7/11* (2006.01)
*C09D 5/24* (2006.01)

(52) U.S. Cl.
USPC ........ 252/500; 430/271.1; 430/330; 430/321; 430/296

(58) Field of Classification Search
None
See application file for complete search history.

(56) References Cited

U.S. PATENT DOCUMENTS

| | | | |
|---|---|---|---|
| 4,491,628 A | | 1/1985 | Ito et al. |
| 5,350,485 A | * | 9/1994 | Shiraishi et al. ............... 216/13 |
| 5,437,893 A | * | 8/1995 | Murai et al. .................. 427/498 |
| 5,563,022 A | * | 10/1996 | Binder et al. ............ 430/270.14 |
| 5,776,659 A | * | 7/1998 | Watanabe et al. ............. 430/296 |
| 5,886,102 A | * | 3/1999 | Sinta et al. .................... 525/154 |
| 5,994,007 A | | 11/1999 | Sato et al. |
| 6,024,895 A | * | 2/2000 | Shimizu et al. ............... 252/500 |
| 6,054,254 A | | 4/2000 | Sato et al. |
| 2003/0045426 A1 | * | 3/2003 | Ito ................................. 503/217 |
| 2005/0048413 A1 | | 3/2005 | Nakasugi |
| 2005/0277055 A1 | | 12/2005 | Kon |
| 2007/0228365 A1 | * | 10/2007 | Jung .............................. 257/40 |
| 2009/0253076 A1 | * | 10/2009 | Sakaguchi et al. ......... 430/286.1 |

FOREIGN PATENT DOCUMENTS

| | | |
|---|---|---|
| EP | 0 552 382 A1 | 7/1993 |
| JP | 04-032848 A | 2/1992 |
| JP | 08-109351 A | 4/1996 |
| JP | 11-072925 A | 3/1999 |
| JP | 11-119441 A * | 4/1999 |
| JP | 11-243054 A | 9/1999 |
| JP | 2000-191916 A | 7/2000 |
| JP | 2001-272788 A | 10/2001 |
| JP | 2003-029410 A | 1/2003 |
| JP | 2005-114921 A | 4/2005 |
| JP | 2005-156816 A | 6/2005 |
| JP | 2006-023699 A | 1/2006 |
| JP | 2007-017950 A | 1/2007 |
| WO | 2004/048458 A1 | 6/2004 |
| WO | 2007/023710 A1 | 3/2007 |

OTHER PUBLICATIONS

English translation of JP, 11-119441, A (1999) from machine translation from AIPN Japan Patent Office National center for Industrial Property Information and Training, generated Dec. 27, 2010, 8 pages.*
RN 167860-86-8, first name Benzenesulfonic acid, 3-amino-4-methoxy-, homopolymer, From Registry file of ACS on STN, entered STN on Sep. 19, 1995, one page.*
English translation of JP, 2003-029410, A (2003) from machine translation from AIPN Japan Patent Office National center for Industrial Property Information and Training, generated Oct. 29, 2010, 18 pages.*
Houlihan et al, "Nitrobenzyl Ester Chemistry for Polymer Porcesses Involving Chemical Amplification" Macromolecules, 1988, vol. 21, pp. 2001-2006.*
Shimizu et al "Synthesis and Applications of Sulfonated Polyaniline", Synthetic Metals 85 (1997) 1337-1338.*
International Search Report for PCT/JP2007/055665, mailing date of Jun. 26, 2007, PCT/ISA/210 Form Only.
European Search Report dated Jun. 8, 2011, issued in corresponding European Patent Application No. 07739108.4.
European Official Communication dated May 3, 2012, issued in corresponding European Patent Application No. 07739108.4 (5 pages).
European Office Action dated Feb. 13, 2013, isused in corresponding European Patent Application No. 07739108.4.
Naarmann, H. "Polymers, Electrically Conducting", Ullmann's Encyclopedia of Industrial Chemistry, vol. 29, p. 295-314, Jun. 15, 2000; cited in European Office Action dated Feb. 13, 2013.

* cited by examiner

*Primary Examiner* — Cynthia Hamilton
(74) *Attorney, Agent, or Firm* — Westerman, Hattori, Daniels & Adrian, LLP

(57) ABSTRACT

A material for forming a conductive antireflection film contains: a base resin having conductivity; a crosslinking agent; a thermal acid generator; and a solvent.

6 Claims, 12 Drawing Sheets

US 8,557,144 B2

MATERIAL FOR FORMING CONDUCTIVE ANTIREFLECTION FILM, METHOD FOR FORMING CONDUCTIVE ANTIREFLECTION FILM, METHOD FOR FORMING RESIST PATTERN, SEMICONDUCTOR DEVICE, AND MAGNETIC HEAD

CROSS-REFERENCE TO RELATED APPLICATIONS

This application is a continuation of PCT/JP 2007/055665, and based upon and claims the benefit of priority of the prior International Patent Application No. PCT/JP 2007/055665, filed on Mar. 20, 2007, the entire contents of which are incorporated herein by reference.

FIELD

The embodiments discussed herein are related to a material for forming a conductive antireflection film that is used as a base of a resist at the time a semiconductor device or a magnetic head is produced, a method for forming a conductive antireflection film, a method for forming a resist pattern in which a resist pattern is formed in the resist film formed on a conductive antireflection film formed of the material for forming a conductive antireflection film, a semiconductor device and a magnetic head.

BACKGROUND

In recent years semiconductor integrated circuits have been highly integrated, and LSI and VLSI have been made and used in actual practices. Along this trend in the art, the minimum line-width of a wiring pattern has been reduced to as small as 0.2 µm or less, the smallest being 0.1 µm or less. To form the wiring pattern fine, the technique of lithography, in which a processing substrate is covered with a resist film, the resist film is selectively exposed and then developed so as to form a resist pattern, the processing substrate is dry etched using the resist pattern as a mask, and then resist pattern is removed to thereby obtain a desired pattern (e.g., a wiring pattern). In this technique of the lithography, a wavelength of exposure light (light used for exposure) is shorten, and moreover the formation of a further fine pattern has been considered by using ionizing radiations such as an electron beam, and X-ray. Especially the lithography technique using ionizing radiations such as an electron beam and X-ray has been positioned as an exposure technique of the following generation, and thus a development of a resist material, which is corresponded to the characteristic of ionizing radiations and has high sensitivity and high resolution, and a method for forming a pattern has been desired.

As the resist material corresponding to the lithography technique using ionizing radiation such as an electron beam or X-ray, there has been a high degree of expectation for a chemically amplified resist containing an acid generator (for example, see U.S. Pat. No. 4,491,628). For example as described in Patent Literature 1, this chemically amplified resist generates acid from a photo acid generator by exposing the same to ultraviolet ray, electron beam, X-ray, or focused ion beam, and the exposed region is changed to an alkali-soluble (positive) or alkali-insoluble (negative) material by baking the resist after exposure and utilizing a catalytic reaction. Accordingly, apparent quantum yield is improved to achieve high sensitivity. Such chemically amplified resist generally contains a base resin, a photo acid generator, various additives and a solvent, and in case of a negative resist, a crosslinking agent is further added.

However, such chemically amplified resist material has insulating properties. Therefore, when exposure is performed with an electron beam, charges are accumulated at the time of the exposure, namely a charge-up phenomenon is caused, and as a result there is a problem such that a position of the formed resist pattern is shifted.

To solve the problem of dislocation of the resist pattern, there has been disclosed a method for preventing the accumulation of charges, in which a conductive resin is coated on a surface of a resist film formed of the chemically amplified resist film to form an antistatic film on the resist film (see Japanese Patent Application Laid-Open (JP-A) Nos. 04-32848 and 08-109351).

However, the conductive resin becomes compatible to a material of a resist film at the time the conductive resin is coated on a surface covered with the resist film, and there are problems such that a pattern is dissolved, or in contrast becomes insoluble at the time of patterning, and the formation of the pattern is failed. Moreover, the scattering of electrons is caused within the antistatic film laminated on the resist film, and thus resolution of the resist pattern is lowered.

The electron beam exposure enables to form fine patterns, but on the other hand, there is a downside that the throughput of the electron beam exposure is significantly inferior to an exposure system using light, because of the drawing method thereof. To compensate this low throughput, a method for carrying out exposure in a light exposure system for a relatively large pattern and carry out exposure using an electron beam for only fine patterns on the identical layer, i.e. an overlay mix and match system, has been proposed.

In the case where the overlay mix and match system is used, it is necessary to use an antistatic film for suppressing the charge-up, with respect to the electron beam exposure. Therefore, as well as the complication of the process, the antistatic film has a large influence to the formation of the resist pattern such as deteriorations of resolution and sensitivity.

Moreover, there has been an attempt to make a constituting material of an antireflection film, which will be paced as an underlying layer of a resist, conductive, and to suppress the charge-up phenomenon without forming an antistatic film (see for example, JP-A No. 2000-191916).

However, in this method, the surface resistance of the antireflection film is as high as $4 \times 10^7 \Omega$ (insufficient conductivity) because a base resin itself does not has conductivity, and thus it is difficult to suppress the charge-up at the time fine patterns are formed.

Accordingly, it is a current situation that a conductive antireflection film which has an excellent antistatic effect as well as suppressing a reflection of ultraviolet ray, and is capable of simply forming a fine resist pattern, wiring pattern, or the like at high resolution and low cost without causing omission or dislocation of the pattern, has not yet provided, and the development of such technology has been desired.

SUMMARY

According to an aspect of embodiments, a material for forming a conductive antireflection film contains a base resin having conductivity, a crosslinking agent, a thermal acid generator, and a solvent.

According to another aspect of embodiments, a method for forming a conductive antireflection film contains applying the aforementioned material for forming a conductive antireflection film on a substrate, and heating the substrate on which the material for forming a conductive antireflection is applied.

According to another aspect of embodiments, a method for forming a resist pattern contains forming a resist film on a conductive antireflection film formed on a substrate by the aforementioned method for forming a conductive antireflection film, selectively exposing the formed resist film to exposure light, and developing the exposed resist film so as to form a pattern.

According to another aspect of embodiments, a semiconductor device is produced using the resist pattern formed by the aforementioned method for forming a resist pattern.

According to another aspect of embodiments, a magnetic head is produced using a resist pattern by the aforementioned method for forming a resist pattern.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
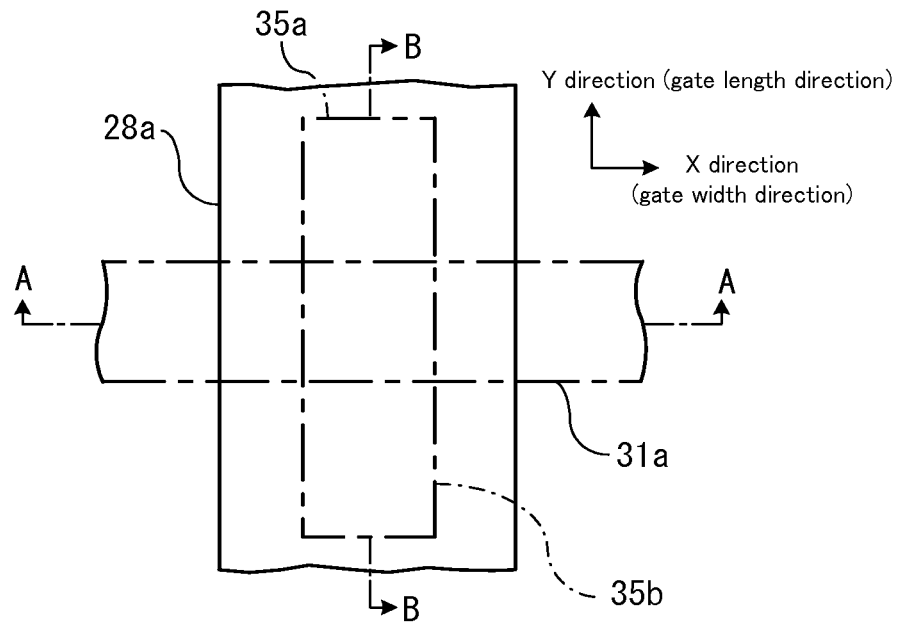
FIG. 1 is a plane diagram illustrating a first example of FLASH EPROM produced by the method for producing a semiconductor device.

Hereinafter, the present invention will be specifically explained with reference to the drawing illustrating embodiments thereof. However, these embodiments shall not be construed as to limit the scope of the invention.

(Material for Forming Conductive Antireflection Film)

The material for forming a conductive antireflection film of the invention at least contains a base resin having conductivity, a crosslinking agent, a thermal acid generator, and a solvent, and further contains other substances appropriately selected as necessity.

As the base resin has conductivity, the material for forming a conductive antireflection film of the invention exhibits excellent effect for preventing charging at the time a resist pattern is formed. Even when the resist film is exposed to ionizing radiation such as an electron beam and X-ray, the charge will not be accumulated, and thus it is possible to form a resist pattern without causing omission or dislocation of the pattern Moreover, as the base resin absorbs an ultraviolet ray, the material for forming a conductive antireflection film of the invention excels in the antireflection effect, prevents reflection of exposure light at the resist base even when exposure is performed with an ultraviolet ray for the formation of a resist pattern, and also prevents the generation of standing waves, which is cased by the reflection of the exposure light, inside the resist. Accordingly, a resist pattern can be formed without forming roughness on side walls of the pattern.

Moreover, as the material for forming a conductive antireflection film of the invention contains a thermal acid generator and a crosslinking agent, a rigid composition which does not mix with the resist or dissolve with a resist developer can be obtained, and thus a resist pattern of high resolution can be formed. Therefore, a fine resist pattern can be simply and efficiently formed.

—Base Resin—

The base resin is appropriately selected depending on the intended purpose without any restriction, provided that it has conductivity.

Here, the conductivity means that charging of the resist layer due to static electricity is prevented and/or removed. More specifically, it means that the conductive antireflection film has surface resistance of $1 \times 10^7$ $\Omega/cm^2$ or less. Note that, the surface resistance is a value measured by a resistivity meter (MCP-HT250, manufactured by Mitsubishi Chemical Corporation).

Preferable examples of the base resin include polyaniline, polyparaphenyl vinylene, polythiophene, polypyrrole, poly-p-phenylene oxide, polyfuran, polyphenylene, polyazine, polyselenophene, polyphenylene sulfide, and polyacetylene. Among them, polyaniline, and polythiophene, which are represented by any of General Formulae 1 to 5, are more preferable.

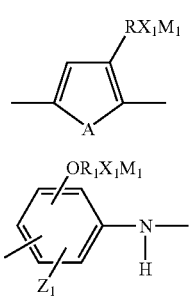

General Formula 1

General Formula 2

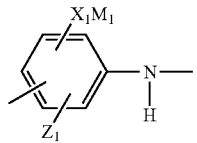

General Formula 3

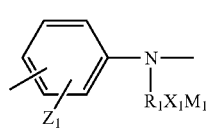

General Formula 4

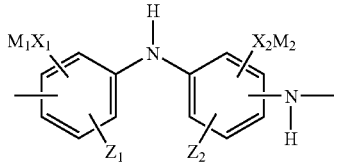

General Formula 5

Note that, in General Formulae 1 to 5, A is NH, S, or O; R is $R_1$ or $OR_1$; $R_1$ is C1-8 linear hydrocarbon, C1-8 branched hydrocarbon, or C1-8 hydrocarbon including an ether bonding; each of $X_1$ and $X_2$ is $SO_3$ or COO; each of $Z_1$ and $Z_2$ is H, $OR_1X_1H$, $OR_1H$, or an electron donating group; each of $M_1$ and $M_2$ is hydrogen ion, ammonium ion, C1-8 alkyl ammonium ion, aromatic ammonium ion, or heterocyclic quaternary ion.

Examples of the electron donating group include halogen group, C1-8 alkoxy group, C1-8 alkenyl group, and C1-8 alkyl group.

Examples of the aromatic ammonium ion include aniline, 2-methoxy aniline, 3-methoxy aniline, 4-methoxy aniline, and ammonium ion of the derivatives having those skeletons.

Examples of the heterocyclic quaternary ion include piperidine, pyrrolidine, morpholine, piperazine, pyridine, α-picoline, β-picoline, γ-picoline, quinoline, isoquinoline, pyrroline, and ammonium ion of derivatives having these structures.

Specific examples of the base resin include poly[thiophene-3-(3-propane sulfonate)] (A1 mentioned later), aniline-2-methoxy-5-propyloxy-3-sulfonate polymer (A2 mentioned later), 3-amino-4-methoxybenzene sulfonate polymer (A3 mentioned later), and 3-amino-4-methoxybenzene sulfonate/3-amino-4-methylbenzene sulfonate (60/40) copolymer (A5 mentioned later). Moreover, examples thereof include polymers including a monomer unit of furan-3-(2-ethane sulfonate), furan-3-(3-propane sulfonate), furan-3-(4-butane sulfonate), furan-3-(5-pentane sulfonate), furan-3-(6-hexane sulfonate), pyrrole-3-(2-ethane sulfonate), pyrrole-3-(3-propane sulfonate), pyrrole-3-(4-butane sulfonate), pyrrole-3-(5-pentane sulfonate), pyrrole-3-(6-hexane sulfonate), 2-methoxy-5-(propyloxy-3-sulfonic acid)-1,4-phenylene vinylene, 2-ethoxy-5-(propyloxy-3-sulfonic acid)-1,4-phenylene vinylene, 2-propyloxy-5-(propyloxy-3-sulfonic acid)-1,4-phenylene vinylene, 2-butyloxy-5-(propyloxy-3-sulfonic acid)-1,4-phenylene vinylene, 2,5-bis(propyloxy-3-sulfonic acid)-1,4-phenylene vinylene, 2,5-bis (ethyloxy-2-sulfonic acid)-1,4-phenylene vinylene, 2,5-bis (butyloxy-4-sulfonic acid)-1,4-phenylene vinylene, 5-(propyloxy-3-sulfonic acid)-1,4-phenylene vinylene, 5-(ethyloxy-2-sulfonic acid)-1,4-phenylene vinylene, 5-(butyloxy-4-sulfonic acid)-1,4-phenylene vinylene, 5-(pentyloxy-4-sulfonic acid)-1,4-phenylene vinylene, aniline-3-(2-ethane sulfonate), aniline-3-(3-propane sulfonate), aniline-3-(4-butane sulfonate), aniline-3-(5-pentane sulfonate), aniline-3-(6- hexane sulfonate), aniline-3-(7-heptane sulfonate), aniline-3-(2-methyl-3-propane sulfonate), aniline-3-(2-methyl-4-butane sulfonate), aniline-3-sulfonate (A4 mentioned later), aniline-N-(2-ethane sulfonate), aniline-N-(3-propane sulfonate), aniline-N-(4-butane sulfonate), aniline-N-(5-pentane sulfonate), aniline-N-(6-hexane sulfonate), aniline-N-(7-heptane sulfonate), aniline-N-(2-methyl-3-propane sulfonate), aniline-N-(2-methyl-4-butane sulfonate), 2-aminoanisole-3-sulfonate, 2-aminoanisole-4-sulfonate, 2-aminoanisole-5-sulfonate, 2-aminoanisole-6-sulfonate, 3-aminoanisole-2-sulfonate, 3-aminoanisole-4-sulfonate, 3-aminoanisole-5-sulfonate, 3-aminoanisole-6-sulfonate, 4-aminoanisole-2-sulfonate, 4-aminoanisole-3-sulfonate, 2-amino-4-ethoxybenzene sulfonate, 3-amino-4-ethoxybenzene sulfonate, 2-amino-4-butoxybenzene sulfonate, 3-amino-6-butoxybenzene sulfonate, 2-amino-4-propoxybenzene sulfonate, 3-amino-6-propoxybenzene sulfonate, 2-amino-4-isobutoxybenzene sulfonate, 3-amino-4-isobutoxybenzene sulfonate, 3-amino-4-t-butoxybenzene sulfonate, 2-amino-4-t-butoxybenzene sulfonate, 2-amino-4-heptoxybenzene sulfonate, 3-amino-5-heptoxybenzene sulfonate, 2-amino-4-hexoxybenzene sulfonate, 3-amino-5-octoxybenzene sulfonate, 2-amino-4-nanoxybenzene sulfonate, 3-amino-6-decanoxybenzene sulfonate, 2-amino-4-undecanoxybenzene sulfonate, 3-amino-6-dodecanoxybenzene sulfonate, and the like. These may be used singly, or in combination of two or more.

—Crosslinking Agent—

The crosslinking agent is appropriately selected depending on the intended purpose without any restriction, provided that it functions to crosslink the base resin having conductivity. For example, the crosslinking agent is an amino crosslinking agent.

Examples of the amino crosslinking agent include melamine derivatives, urea derivatives, and uril derivatives. These may be used singly, or in combination of two or more.

Examples of the melamine derivatives include alkoxymethyl melamine, hexamethoxymelamine (B2 mentioned later) and derivatives thereof.

Examples of the urea derivatives include urea, alkoxyethylene urea, N-alkoxymethylene urea, ethylene urea (e.g. N,N'-dimethoxymethyldimethoxyethylene urea (B1 mentioned later)), ethyleneurea carboxylate, and derivatives thereof.

Examples of the uril derivatives include benzoguanamine, glycol uril (e.g., tetramethoxymethylglycol uril (B3 mentioned later)), and derivatives thereof.

The amount of the crosslinking agent is preferably 0.5% by mass to 50% by mass, more preferably 1% by mass to 40% by mass, with respect to the amount of the base resin. When the amount of the crosslinking agent is less than 0.5% by mass, the crosslinking reaction may not sufficiently proceed in the base resin. When the amount of the crosslinking agent is more than 50% by mass, the crosslinking reaction may be extended to unexposed portions.

—Thermal Acid Generator—

The thermal acid generator is appropriately selected depending on the intended purpose without any restriction. Examples of the thermal acid generator include aliphatic sulfonic acid, aliphatic sulfonic acid salt, aliphatic carboxylic acid, aliphatic carboxylic acid salt, aromatic sulfonic acid, aromatic sulfonic acid salt, aromatic carboxylic acid, aromatic carboxylic acid salt, metal salt, phosphoric acid ester, and nitrobenzyl tosylate. These may be used singly or in combination of two or more.

Specific examples of the thermal acid generator include methyl benzenesulfonate, ethyl benzenesulfonate, propyl benzenesulfonate, methyl-p-toluenesulfonate, methyl-o-toluenesulfonate, ethyl-p-toluenesulfonate, ethyl-o-toluenesulfonate, methyl naphthalenesulfonate, ethyl-4-methoxybenzenesulfonate, 2-butoxyethyl-p-toluenesulfonate, 2-phenoxyethyl benzenesulfonate, benzyl-3-methoxycarbonylbenzenesulfonate, 2-nitroethyl benzenesulfonate, 3-acetoaminopropyl-p-toluenesulfonate, diethyl sulfate, di-n-propyl sulfate, di-n-butyl sulfate, bis(2-ethylhexyl)sulfate, dilauryl sulfate, distearyl sulfate, bis(2-phenethyl)sulfate, bis(α-naphthylmethyl)sulfate, dibenzyl sulfate, bis(2-butoxyethyl)sulfate, bis(2-phenoxyethyl)sulfate, bis(2-octylthioethyl)sulfate, bis[2-(4-tolyl)thioethyl]sulfate, bis(4-nitroethyl)sulfate, bis(2-chloroethyl)sulfate, dicyclohexyl sulfate, bis(4-methylcyclohexyl)sulfate, bis(4-methoxycyclohexyl)sulfate, bis(4-butylthiocyclohexyl)sulfate, 2-nitrobenzyl tosylate, 2,4-dinitrobenzyl tosylate, 2,6-dinitrobenzyl tosylate, 4-nitrobenzyl tosylate, 1-trifluoromethyl-6-nitrobenzyl-4-chlorobenzene sulfonate, 2-trifluoromethyl-6-nitrobenzyl-4-nitrobenzene sulfonate, and aliphatic onium salt (e.g., 2-butynyl tetramethylene sulfonium hexafluoroantimonate).

Moreover, other than the thermal acid generator, it may be possible to use a photo acid generator. The photo acid generator is appropriately selected depending on the intended purpose without any restriction. Examples of the photo acid generator include an onium salt, a sulfonium salt, a halogen-containing triazine compound, a sulfone compound, an aromatic sulfonate compound, and a sulfonate compound of N-hydroxy imide.

Examples of the onium salt include diaryl iodonium salt, triaryl selenonium salt, and triaryl sulfonium salt.

Examples of the diaryl iodonium salt include diphenyl iodonium trifluoromethane sulfonate, (4-methoxyphenyl)(phenyl)iodonium hexafluoroantimonate, (4-methoxyphenyl)(phenyl)iodonium trifluoromethane sulfonate, bis(4-tert-butylphenyl)iodonium tetrafluoroborate, bis(4-tert-butylphenyl)iodonium hexafluorophosphate, bis(4-tert-butylphenyl)iodonium hexafluoroantimonate, and bis(4-tert-butylphenyl)iodonium trifluoromethane sulfonate.

Examples of the triaryl selenonium salt include triphenyl selenonium hexafluorosulfonate, triphenyl selenonium fluoroborate, triphenyl selenonium hexafluoroantimonate salt.

Examples of the triaryl sulfonium salt include triphenyl sulfonium hexafluorophosphonium salt, triphenyl sulfonium hexafluoroantimonate salt, diphenyl-4-thiophenoxyphenyl sulfonium hexafluoroantimonate salt, and diphenyl-4-thiophenoxyphenyl sulfonium pentafluorohydroxyantimonate salt.

Examples of the sulfonium salt include triphenyl sulfonium hexafluorophosphate, triphenyl sulfonium hexafluoroantimonate, triphenyl sulfonium trifluoromethane sulfonate, 4-methoxyphenyldiphenyl sulfonium hexafluoroantimonate, 4-methoxyphenyldiphenylsulfonium trifluoromethane sulfonate, p-tridiphenyl sulfonium trifluoromethane sulfonate, 2,4,6-trimethylphenyldiphenyl sulfonium trifluoromethane sulfonate, 4-tert-butylphenyldiphenyl sulfonium triflurometane sulfonate, 4-phenylthiophenyldiphenyl sulfonium hexafluorophosphate, 4-phenylthiophenyldiphenyl sulfonium hexafluoroantimonate, 1-(2-naphthoylmethyl)thiolaunium hexafluoroantimonate, 1-(2-naphthoylmethyl)thiolanium trifluoromethane sulfonate, 4-hydroxy-1-naphthyldimethyl sulfonium hexafluoroantimonate, and 4-hydroxy-1-naphthyldimethyl sulfonium trifluoromethane sulfonate.

Examples of the halogen-containing triazine compound include 2-methyl-4,6-bis(trichloromethyl)-1,3,5-triazine, 2,4,6-tris(trichloromethyl)-1,3,5-triazine, 2-phenyl-4,6-bis(trichloromethyl)-1,3,5-triazine, 2-(4-chlorophenyl)-4,6-bis (trichloromethyl)-1,3,5-triazine, 2-(4-methoxyphenyl)-4,6-bis(trichloromethyl)-1,3,5-triazine, 2-(4-methoxy-1-naphthyl)-4,6-bis(trichloromethyl)-1,3,5-triazine, 2-(benzo[d][1,3]dioxolan-5-yl)-4,6-bis(trichloromethyl)-1,3,5-triazine, 2-(4-methoxystyryl)-4,6-bis(trichloromethyl)-1,3,5-triazine, 2-(3,4,5-trimethoxystyryl)-4,6-bis(trichloromethyl)-1,3,5-triazine, 2-(3,4-dimethoxystyryl)-4,6-bis(trichloromethyl)-1,3,5-triazine, 2-(2,4-dimethoxystyryl)-4,6-bis(trichloromethyl)-1,3,5-triazine, 2-(2-methoxystyryl)-4,6-bis(trichloromethyl)-1,3,5-triazine, 2-(4-butoxystyryl)-4,6-bis(trichloromethyl)-1,3,5-triazine, and 2-(4-pentyloxystyryl)-4,6-bis(trichloromethyl)-1,3,5-triazine.

Examples of the sulfone compound include diphenyl disulfone, di-p-tolyl disulfone, bis(phenylsulfonyl)diazomethane, bis(4-chlorophenylsulfonyl)diazomethane, bis(p-tolylsulfonyl)diazomethane, bis(4-tert-butylphenylsulfonyl)diazomethane, bis(2,4-xylylsulfonyl)diazomethane, bis(cyclohexylsulfonyl)diazomethane, (benzoyl)(phenylsulfonyl)diazomethane, and phenylsulfonyl acetophenone.

Examples of the aromatic sulfonate compound include α-benzoylbenzyl p-toluene sulfonate (i.e. benzoin tosylate), β-benzoyl-β-hydroxyphenethyl p-toluene sulfonate (i.e. α-methylol benzoin tosylate), 1,2,3-benzenetriyl trismethane sulfonate, 2,6-dinitrobenzyl p-toluene sulfonate, 2-nitrobenzyl p-toluene sulfonate, and 4-nitrobenzyl p-toluene sulfonate.

Examples of the sulfonate compound of N-hydroxyimide include N-(phenylsulfonyloxy)succinimide, N-(trifluoromethylsulfonyloxy)succinimide, N-(p-chlorophenylsulfonyloxy)succinimide, N-(cyclohexylsulfonyloxy)succinimide, N-(1-naphthylsulfonyloxy)succinimide, N-(benzylsulfonyloxy)succinimide, N-(10-camphor sulfonyloxy)succinimide, N-(trifluoromethylsulfonyloxy)phthalimide, N-(trifluoromethylsulfonyloxy)-5-norbornene-2,3-dicarboxyimide, N-(trifluoromethylsulfonyloxy)naphthalimide, and N-(10-camphor sulfonyloxy)naphthalimide.

Among them, the triaryl sulfonium salt, aryl iodonium salt, triaryl selenonium salt are preferable, as they have high quantum yields, and can be released from a film as gas after decomposition thereof.

The amount of the thermal acid generator is preferably 0.5% by mass to 40% by mass with respect to the amount of the base resin.

—Solvent—

The solvent contains at least one of an organic solvent and water.

The organic solvent is selected from those generally used in the art without any restriction, provided that it can dissolve each component of the material for forming a conductive antireflection film, and has appropriate drying speed, as well as a uniformly smooth coated film can be formed after evaporation thereof.

Examples of such organic solvent include glycol ether esters, glycol ethers, esters, ketones, cyclic esters, and alcohols.

Examples of the glycol ether esters include ethyl cellosolve acetate, methyl cellosolve acetate, propylene glycol monomethyl ether acetate, and propylene glycol monoethyl ether acetate.

Examples of the glycol ethers include ethyl cellosolve, methyl cellosolve, propylene glycol monomethyl ether, propylene glycol monoethyl ether, and propylene glycol monopropyl ether (El mentioned later).

Examples of the esters include ethyl lactate, butyl acetate, amyl acetate, and ethyl pyruvate.

Examples of the ketones include 2-heptanone, and cyclohexane.

Examples of the cyclic esters include γ-butyrolactone.

Examples of the alcohols include methanol, ethanol, propanol, isopropanol, and butanol.

These organic solvents may be used singly or in combination of two or more.

—Other Substances—

The aforementioned other substances are appropriately selected depending on the intended purpose without any restriction, provided that they do not adversely affect the obtainable effects of the invention. For example, other substances are various additives known in the art. For example, in the case where the improvement of the antireflection effect is aimed, an ultraviolet absorbent having absorbance with respect to a ultraviolet ray may be added, and in the case where the improvement of the dissolution or coating properties of the material for forming a conductive antireflection film is aimed, isopropyl alcohol or a surfactant may be added.

The ultraviolet absorbent is appropriately selected depending on the intended purpose without any restriction. For example, benzophenone is used as the ultraviolet absorbent.

The surfactant is appropriately selected depending on the intended purpose without any restriction. Examples of the surfactant include a nonionic surfactant, a cationic surfactant, an anionic surfactant, and an ampholytic surfactant. These may be used singly, or in combination of two or more. Among them the nonionic surfactant is preferable as it does not include a metal ion.

Examples of the nonionic ion include an alkoxylate surfactant, a fatty acid ester surfactant, an amide surfactant, an alcohol surfactant, and ethylene diamine surfactant. Specific examples of these surfactants include polyoxyethylene-polyoxypropylene condensate, polyoxyalkylene alkyl ether, polyoxyethylene alkyl ether, polyoxyethylene derivative, sorbitane fatty acid ester, glycerin fatty acid ester, primary alcohol ethoxylate, phenol ethoxylate, nonylphenol ethoxylate, octylphenol ethoxylate, lauryl alcohol ethoxylate, oleyl alcohol ethoxylate, fatty acid ester, amide, natural alcohol, ethylene diamine, and secondary alcohol ethoxylate.

The cationic surfactant is appropriately selected depending on the intended purpose without any restriction. Examples of the cationic surfactant include an alkyl cationic surfactant, amide quaternary cationic surfactant, and ester quaternary cationic surfactant.

The ampholytic surfactant is appropriately selected depending on the intended purpose without any restriction. Examples of the ampholytic surfactant include an amine oxide surfactant, and betaine surfactant.

The amount of the surfactant contained in the material for forming a resist cover film can be appropriately determined depending on the types and amounts of the silica contained polymer having at least the alkali-soluble group, the organic solvent, and the like.

When a conductive antireflection film is formed using the material for forming a conductive antireflection film of the invention, the obtained film preferably has the etching resistance which is the same to, or less than the etching resistance of the resist film.

The etching speed is appropriately adjusted depending on the intended purpose without any restriction, and is varied depending on the type of gas for use, pressure, voltage or the like. For example, when mixed gas of carbon tetrafluoride and oxygen in the ratio of 96/4 is used as etching gas under the conditions such that the electrode voltage is 50 W/cm$^2$, and pressure is 0.03 Torr, the etching speed is preferably 90% or more relative to an etching speed of a novolac resist which has been commonly used, and more preferably 100% or more relative to the etching speed of a novolac resist as such the speed is sufficient in the practical use.

Note that, the etching speed is measured, for example, in such manner that a sample is etched for a predetermined period by means of a conventional etching device, and the reduced amount of the sample film is measured and the reduced amount of the sample film per unit time is calculated.

Since the material for forming a conductive antireflection film contains the base resin having conductivity, the material for forming a conductive antireflection film has an excellent antistatic effect as well as preventing reflection of ultraviolet ray, and is highly sensitive. In addition, as the base resin can be used together with a thermal acid generator and a crosslinking agent in the material for forming a conductive antireflection film, a fine resist pattern, wiring pattern, or the like is formed at high resolution, low cost, and with a simple process, without causing omission or dislocation of the pattern, by preventing the accumulation of charges even when an electron beam is used as exposure light for the formation of the pattern.

(Method for Forming Conductive Antireflection Film)

The method for forming a conductive antireflection film of the invention at least contains a coating step, that is, applying the material for forming a conductive antireflection film of the invention on a substrate, and a heating step, that is, heating the substrate on which the material for forming a conductive antireflection film has been coated, and further contain appropriately selected other steps, as necessity.

—Coating Step—

The conductive antireflection film of the invention may be formed in the conventional method, such as by coating. The method for coating is appropriately selected from the conventional coating methods depending on the intended purpose without any restriction. For example, spin coating is a suitable coating method. In case of the spin coating, the conditions are for example a revolution number of about 100 rpm to 10,000 rpm, preferably 800 rpm to 5,000 rpm, and duration of about one second to about 10 minutes, preferably one second to 90 seconds.

The thickness for the coating is appropriately selected depending on the intended purpose without any restriction.

The processing surface (substrate) is appropriately selected depending on the purpose without any restriction. In the case where the conductive antireflection film is formed for an electronic device such as a semiconductor device, the processing surface (substrate) is for example a surface of a semiconductor substrate. In the case where the conductive antireflection film is formed for the production of a magnetic head, the processing surface (substrate) is for example a surface of an alloy substrate. Specific examples thereof include substrates such as a silicon wafer or AlTiC wafer, and various oxidized films.

—Heating Step—

At the time of or after the applying, it is preferred that the applied material for forming a conductive antireflection film is baked (heated and dried), and the conditions and method thereof may be appropriately selected depending on the intended purpose without any restriction. For example, the temperature for baking is preferably about 50° C. to about 300° C., more preferably 100° C. to 250° C., and the duration thereof is preferably about 10 seconds to about 5 minutes, more preferably 30 seconds to 90 seconds. When the temperature is 50° C. or less, the decomposition of the thermal acid generator and crosslinking reaction may not be sufficiently proceeded. When the temperature is 300° C. or more, the base resin may be thermally decomposed.

—Other Steps—

Other steps other than the coating step and the heating step may be performed as necessity.

The formed conductive antireflection film has surface resistance of preferably $1 \times 10^7$ Ω/sq. or less, more preferably $8 \times 10^6$ Ω/sq. or less. When the surface resistance is more than $1 \times 10^7$ Ω/sq., the effect for preventing a charge up phenomenon may not be sufficiently exhibited, and dislocation of pattern may be caused.

According the method for forming a conductive antireflection film, the material for forming a conductive reflection film containing at least a base resin having conductivity, a crosslinking agent, a thermal acid generator, and a solvent is applied on a substrate in the aforementioned step of the applying, and the substrate on which the material for forming a conductive antireflection film is applied is heated in the aforementioned step of the heating. As a result, reflection of ultraviolet ray is suppressed, an excellent antistatic effect is exhibited, high sensitivity is attained, and a fine resist pattern, wiring pattern, or the like is formed at high resolution, low cost, and with a simple process, without causing omission or dislocation of the pattern, by preventing the accumulation of charges even when an electron beam is used as exposure light for the formation of the pattern.

(Method for Forming Resist Pattern)

The method for forming a resist pattern of the invention at least contains a resist film forming step, that is forming a resist film on a conductive antireflection film formed on a substrate by the method for forming a conductive antireflection film of the invention, an exposing step, that is selectively exposing the formed resist film to exposure light, and a developing step, that is developing the exposed resist film to form a pattern, and further contain appropriately selected other steps, as necessity.

—Resist Film Forming Step—

The resist film forming step is forming a resist film on a conductive antireflection film formed on a substrate.

The resist film is formed from a resist composition, and the resist composition preferably contain at least a base resin having conductivity, photo acid generator, a crosslinking agent, and an organic solvent.

—Exposing Step—

The exposing step is exposing the resist film formed on the conductive antireflection film of the invention to exposure light.

The exposing is preferably performed by means of a conventional exposure device, and is carried out by irradiating the resist film with the exposure light. By irradiating of the exposure light, the photo acid generator contained in the resist composition within the exposed area is decomposed and generates acid, and as a result the curing reaction of the resist composition is occurred to form a latent pattern image.

The irradiation of the exposure light is performed on the area that is part of the resist film, and the area that is part of the resist film turns into alkali-insoluble (negative) or alkali-soluble (positive), in a developing step which will be mentioned later, the unexposed area other than the exposed area that is part of the resist film is removed (negative) or remained (positive) to form a resist pattern.

The exposure light is appropriately selected depending on the intended purpose without any restriction. Even though the exposure light, which generates charges in the resist film during or at the time of exposure in the vacuumed condition, fine resist patterns can be formed without dislocation due to the charge up phenomenon. Moreover, by preventing the reflection from the base of the resist film, the generation of standing waves within the resist is prevented, and a fine pattern which has the reduced shape roughness of the pattern side wall can be formed.

From the aforementioned view point, the exposure light is preferably activation energy-grade line such as a ultraviolet ray, X-ray, electron beam, excimer laser beam, and focused ion beam.

In the case where the ultraviolet ray is used, it has preferably the wavelength of 450 nm or less.

In the case where the excimer laser is used, it is preferably KrF excimer laser (wavelength of 248 nm), ArF excimer laser (wavelength of 193 nm), or F2 excimer laser (wavelength of 157 nm).

Moreover, charged corpuscular rays such as an electron beam, focused ion beam, positron beam, α-ray, β-ray, μ-corpuscular ray, π-corpuscular ray, proton beam, heavy proton beam, and heavy ion beam, are particularly preferable as dislocation of a resist pattern may be easily caused due to a charge-up phenomenon and the antistatic effect of the invention may be easily exhibited. With these beams or rays of exposure light, finer resist patterns can be obtained.

In the exposing step, it is preferable that overlay mix and match exposure, which performs exposure on the same resist film at least twice using two or more light sources selected from ultraviolet rays and other ionizing radiations (e.g., KrF excimer laser exposure+ArF excimer laser exposure+electron beam exposure), is applied.

—Developing Step—

The developing step is, after exposing the resist film at the exposure step to thereby cure the area of the resist film which is exposed, removing the uncured area so as to develop the resist film to thereby form a resist pattern.

The method for removing the uncured area is appropriately selected depending on the intended purpose without any restriction. For example, it is a method in which the uncured area is removed using a developer.

The developer is appropriately selected depending on the intended purpose without any restriction, but it is preferably water or alkali solution as loads to the environment can be reduced.

Examples of the alkali for use include: inorganic alkali such as sodium hydroxide, potassium hydroxide, sodium silicate, and ammonium; primary amine such as ethyl amine, and propyl amine; secondary amine such as diethyl amine and dipropyl amine; tertiary amine such as trimethyl amine and tiethyl amine; alcohol amine such as diethyl ethanol amine, and triethanol amine; and quaternary ammonium hydroxide such as tetramethyl ammonium hydroxide, tetraethyl ammonium hydroxide, triethyl hydroxymethyl ammonium hydroxide, and trimethyl hydroxyethyl ammonium.

Moreover, the alkali solution may be added with a water-soluble organic solvent such as methyl alcohol, ethyl alcohol, propyl alcohol or ethylene glycol, a surfactant, and an inhibitor for dissolving a resin, if necessary.

According to the method for forming a resist pattern of the invention, a resist film is formed on a conductive antireflection film containing at least a base resin having conductivity, a crosslinking agent, and a thermal acid generator in the aforementioned step of the forming, the formed resist film is selectively exposed to exposure light in the aforementioned step of the selectively exposing, and a pattern is developed in the aforementioned step of the developing. As a result, reflection of ultraviolet ray is suppressed, an excellent antistatic effect is exhibited, high sensitivity is attained, and a fine resist pattern, wiring pattern, or the like is formed at high resolution, low cost, and with a simple process, without causing omission or dislocation of the pattern, by preventing the accumulation of charges even when an electron beam is used as exposure light for the formation of the pattern.

(Semiconductor Device)

During the formation of the semiconductor, a resist pattern is formed by the method for forming a resist pattern.

In the course of producing the semiconductor, a resist film formed on a conductive antireflection film containing at least a base resin, a crosslinking agent, and a thermal acid generator is selectively exposed, and then a pattern is developed to form a resist pattern. As a result, reflection of ultraviolet ray is suppressed, an excellent antistatic effect is exhibited, high sensitivity is attained, and a fine resist pattern, wiring pattern, or the like is formed at high resolution, low cost, and with a simple process, without causing omission or dislocation of the pattern, by preventing the accumulation of charges even when an electron beam is used as exposure light for the formation of the pattern.

(Magnetic Head)

During the formation of the magnetic head, a resist pattern is formed by the method for forming a resist pattern.

In the course of producing the magnetic head, a resist film formed on a conductive antireflection film containing at least a base resin, a crosslinking agent, and a thermal acid generator is selectively exposed, and then a pattern is developed to form a resist pattern. As a result, reflection of ultraviolet ray is suppressed, an excellent antistatic effect is exhibited, high sensitivity is attained, and a fine resist pattern, wiring pattern, or the like is formed at high resolution, low cost, and with a simple process, without causing omission or dislocation of the pattern, by preventing the accumulation of charges even when an electron beam is used as exposure light for the formation of the pattern.

EXAMPLES

Hereinafter, examples of the invention will be explained, but these examples shall not be construed as limiting the scope of the invention.

Examples 1 to 10, and Comparative Examples 1 to 5

—Preparation of Conductive Antireflection Film—

A material for forming a conductive antireflection film was prepared based on the mixing ratio presented in Table 1 below.

TABLE 1

|  | Base Resin | Crosslinking Agent | Thermal Acid Generator | Additive | Solvent | Bake Temperature (° C.) |
|---|---|---|---|---|---|---|
| Ex. 1 | A1 (100) | B1 (10) | C1 (5) | None | E1 (650) + E2 (250) | 160 |
| Ex. 2 | A2 (100) | B2 (10) | C1 (5) | None | E1 (650) + E2 (250) | 180 |
| Ex. 3 | A3 (100) | B2 (10) | C1 (5) | None | E1 (650) + E2 (250) | 180 |
| Ex. 4 | A4 (100) | B2 (10) | C1 (5) | None | E1 (650) + E2 (250) | 180 |
| Ex. 5 | A5 (100) | B3 (10) | C1 (5) | None | E1 (650) + E2 (250) | 180 |

TABLE 1-continued

|  | Base Resin | Crosslinking Agent | Thermal Acid Generator | Additive | Solvent | Bake Temperature (° C.) |
|---|---|---|---|---|---|---|
| Ex. 6 | A5 (100) | B3 (10) | C1 (5) | D1 (2) | E1 (650) + E2 (250) | 180 |
| Ex. 7 | A3 (100) | B2 (0.5) | C1 (5) | None | E1 (650) + E2 (250) | 180 |
| Ex. 8 | A3 (100) | B2 (50) | C1 (5) | None | E1 (650) + E2 (250) | 180 |
| Ex. 9 | A3 (100) | B2 (10) | C1 (0.5) | None | E1 (650) + E2 (250) | 180 |
| Ex. 10 | A3 (100) | B2 (10) | C1 (40) | None | E1 (650) + E2 (250) | 180 |
| Comp. Ex. 1 | None | None | None | None | None | — |
| Comp. Ex. 2 | A3 (100) | None | None | None | E2 (100) + E3 (900) | 100 |
| Comp. Ex. 3 | A0 (100) | B2 (10) | C1 (5) | D1 (20) | E1 (900) | 180 |
| Comp. Ex. 4 | A3 (100) | B2 (10) | None | None | E1 (650) + E2 (250) | 180 |
| Comp. Ex. 5 | A3 (100) | None | C1 (5) | None | E1 (650) + E2 (250) | 180 |

Note that, in Table 1, the numbers within a parenthesis expresses the addition amount ratio (mass ratio).
The base resins A0 to A5 are as follows:
A0: polyvinyl phenol (base resin having no conductivity)
A1: poly [thiophene-3-(3-propane sulfonate)] (corresponded to General Formula 1)
A2: aniline-2-methoxy-5-propyloxy-3-sulfonate polymer (corresponded to General Formula 2)
A3: 3-amino-4-methoxybenzene sulfonate polymer (corresponded to General Formula 3)
A4: aniline-3-sulfonate polymer (corresponded to General Formula 4)
A5: 3-amino-4 methoxybenzene sulfonate/3-amino-4-methylbenzene sulfonate (60/40) copolymer (corresponded to General Formula 5)
The crosslinking agents B1 to B3 are as follows:
B1: N,N'-dimethoxymethyldimethoxyethylene urea
B2: hexamethoxymethyl melamine
B3: tetramethoxymethyl glycol uril
The thermal acid generator C1 is as follow:
C1: 2-nitrobenzyl tosylate
The additive (ultraviolet absorbent) D1 is as follow:
D1: benzophenone
The solvents E1 to E3 are as follow:
E1: propylene glycol monopropyl ether
E2: isopropyl alcohol
E3: water —Formation of Conductive Antireflection Film—

The material for forming a conductive antireflection film prepared in the mixing ratio presented in Table 1 was coated on an entire surface of silicon wafer on which an oxide film had been formed (manufactured by Mitsubishi Materials Corporation) by spin coating at 1,500 rpm for 20 seconds, and then baked at the temperature presented in Table 1 for 30 seconds. The sheet resistance of the obtained conductive antireflection film was measured by Resistivity Meter (MCP-HT250, manufactured by Mitsubishi Chemical Corporation). The results are presented in Table 1.

—Preparation of Resist Composition—

A resist composition having the following formulation was prepared.

| Base resin: | mevalonic lactone methacrylate/ 2-adamanthyl methacrylate (1/1) copolymer (Mw = 10,000) | 100 parts by mass |
|---|---|---|
| Photo acid generator: | triphenyl sulfonium trifluoromethane sulfonate | 2 parts by mass |
| Additive: | pentyl amine | 0.05 parts by mass |
| Solvent: | propylene glycol monopropyl ether acetate/ propylene glycol monopropyl ether (50/50) | 720 parts by mass |

—Formation of Resist Pattern—

On an entire surface of a conductive antireflection film which had been formed by applying the material for forming a conductive antireflection film onto a processing surface (a surface of a substrate), the resist composition was coated by spin coating at 1,400 rpm for 20 seconds, and then baked at 120° C. for 30 seconds. Note that, in Comparative Example 2, a conductive antireflection film was not formed at an underlying layer of a resist film as a resist base, but instead, the conductive antireflection film was formed on the resist film as an upper layer of the resist film.

Thereafter, a rectangular pattern having a side of 0.5 μm was drawn on the resist film by a KrF excimer laser (wavelength: 248 nm) exposure device via a mask, followed by drawing a rectangular pattern having a side of 0.5 μm by an ArF excimer laser (wavelength: 193 nm) via a mask. Then, using an electron beam exposure device, an electron beam having an acceleration voltage of 50 keV was irradiated to draw a line pattern having a line width of 0.08 μm, and then the resist film was subjected to a post-exposure bake (PEB) at 110° C. for 60 seconds. Then the resist film was developed using 2.38% by mass TMAH solution for one minute to thereby form a resist pattern.

—Evaluation of Dissolution Degree and Dislocation—

The thus obtained resist pattern was observed under an electronic microscopy, and the minimum pattern size which was defined by EB exposure was determined as a dissolution degree.

Moreover, an amount of dislocation of the resist pattern obtained by the EB exposure from a standard position of the silicon wafer was measured by means of an overlay registration metrology system manufactured by KLA-Tencor Corporation, and an average value of the measurements was determined as a dislocation amount.

Moreover, side walls of the patterns obtained by KrF exposure and ArF exposure were observed, and shape roughness of the side walls were observed.

The results of the evaluations for dissolution degrees, dislocation amounts, and shape roughness are presented in Table 2.

TABLE 2

| | Sheet resistance (Ω/sq.) | Dislocation (nm) | Rough side wall (KrF) | Rough side wall (ArF) | Dissolution degree (nm) |
|---|---|---|---|---|---|
| Ex. 1 | $9 \times 10^6$ | 2.6 | Not observed | Not observed | 67 |
| Ex. 2 | $8 \times 10^6$ | 2.3 | Not observed | Not observed | 71 |
| Ex. 3 | $6 \times 10^6$ | 1.8 | Not observed | Not observed | 65 |
| Ex. 4 | $7 \times 10^6$ | 2.3 | Not observed | Not observed | 69 |
| Ex. 5 | $8 \times 10^6$ | 1.7 | Not observed | Not observed | 64 |
| Ex. 6 | $9 \times 10^6$ | 1.6 | Not observed | Not observed | 61 |
| Ex. 7 | $5 \times 10^6$ | 1.8 | Not observed | Not observed | 97 |
| Ex. 8 | $4 \times 10^7$ | 8.7 | Not observed | Not observed | 67 |
| Ex. 9 | $6 \times 10^6$ | 1.8 | Not observed | Not observed | 91 |
| Ex. 10 | $3 \times 10^7$ | 11.2 | Not observed | Not observed | 66 |
| Comp. Ex. 1 | — | 131 | Observed | Observed | 63 |
| Comp. Ex. 2 | $5 \times 10^6$ | 2.1 | Observed | Observed | 118 |
| Comp. Ex. 3 | Impossible to measure | 140 | Not observed | Not observed | 69 |
| Comp. Ex. 4 | $6 \times 10^6$ | — | — | — | — |
| Comp. Ex. 5 | $6 \times 10^6$ | — | — | — | — |

The materials for forming a conductive antireflection film of Comparative Examples 3 and 4 were dissolved in the resist solvent at the time of the formation of the resist film, and thus the resist patterns could not be formed.

The materials for forming a conductive antireflection film of Examples 1 to 6, 8 and 10 were not dissolved in the resist solvent at the time of the formation of the resist film, and the resist of high resolution was obtained compared to those of Examples 7 and 9, both of which are partially dissolved to the resist solvent at the time of the formation of the resist film.

The materials for forming a conductive antireflection film of Examples 1 to 7, and 9 each had lower surface resistance ($1 \times 10^7$ Ω/sq. or less) compared to those of Examples 8 and 10, and thus dislocation of the resist pattern formed on the material for forming a conductive antireflection film was reduced.

Example 11

—Flash Memory and Production Thereof—

Example 11 is one example of a semiconductor of the invention using the material for forming a conductive antireflection film of the invention, and production method thereof. Note that, in Example 11, the following resist films 26, 27, 29 and 32 were formed using the resist compositions of Examples 1 to 10 in the same methods of Examples 1 to 10, using the material for forming a conductive antireflection film of the invention as the base.

Figure 2:
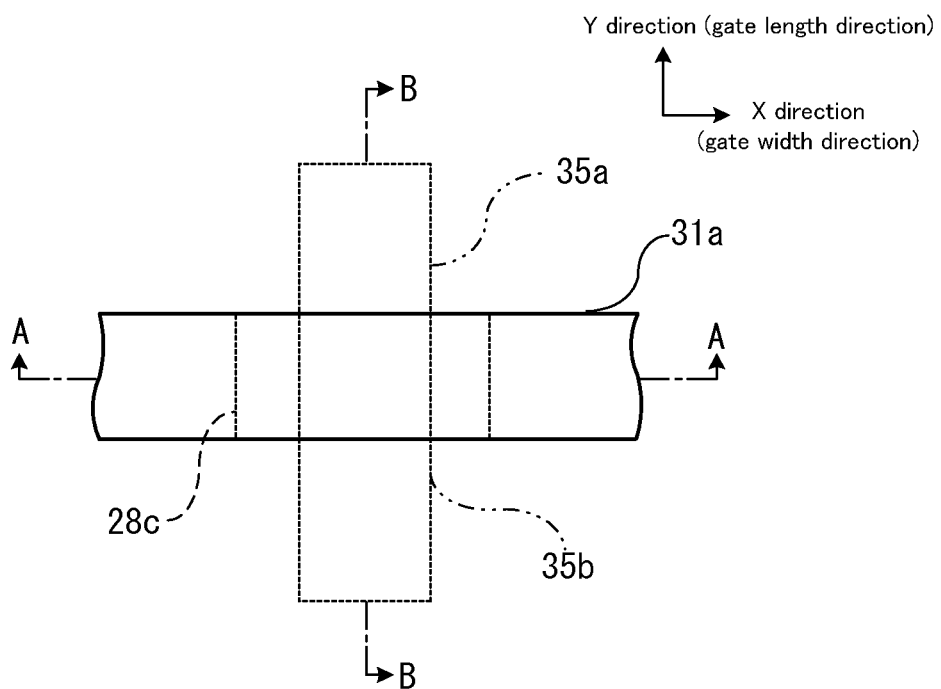
FIG. 2 is a plane diagram illustrating a first example of FLASH EPROM produced by the method for producing a semiconductor device.

FIGS. 1 and 2 are top views (plain views) of FLASH EPROM, that is called FLOTOX-type or ETOX-type; FIGS. 3 to 11 are cross-sectional schematic diagrams for explaining an example of the production method of the FLASH EPROM. In these figures, the left views are schematic sectional views (sectional views taken along lines A-A) of a memory cell unit (a first element region), in a gate width direction (in the X direction in FIGS. 1 and 2), in a portion where a MOS transistor having a floating gate electrode is to be formed. The central views are schematic sectional views (sectional views taken along lines B-B) of the memory cell unit in a gate length direction (in the Y direction in FIGS. 1 and 2) perpendicular to the X direction in the same portion in the left views. The right views are schematic sectional views (in the A direction in FIGS. 1 and 2) of a peripheral circuit unit (a second element region), in a portion where the MOS transistor is formed.

Figure 3:
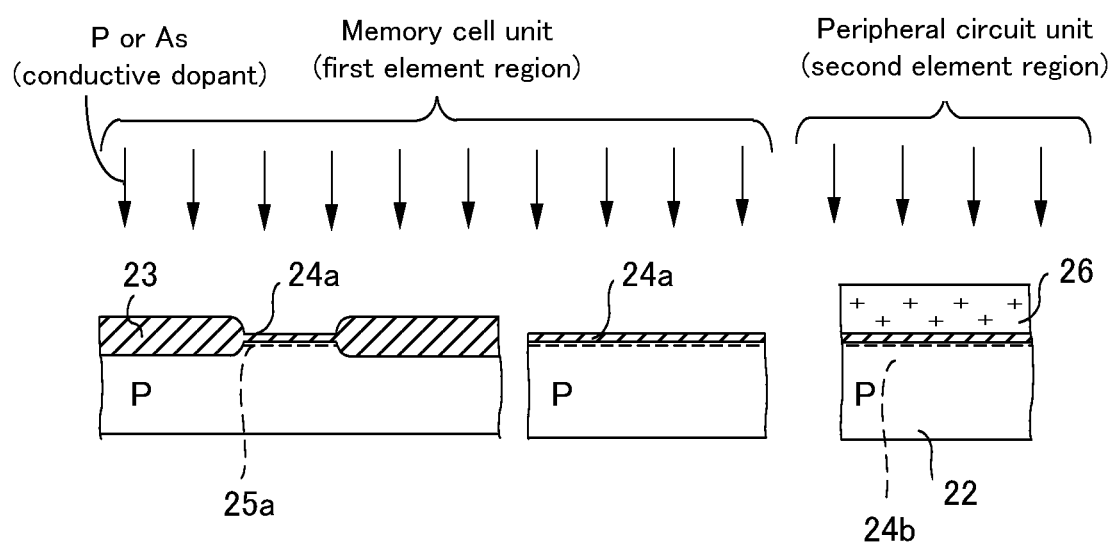
FIG. 3 is a schematic diagram explaining a first example of production of FLASH EPROM according to the method for producing a semiconductor device.

Initially, as illustrated in FIG. 3, a field oxidized film 23 of a SiO$_2$ film was selectively formed in a device isolation region on a p-type Si substrate (a semiconductor substrate) 22. Next, a SiO$_2$ film was formed by thermal oxidation so as to have a thickness of 10 nm to 30 nm (100 angstroms to 300 angstroms) as a first gate insulating film 24a in the MOS transistor in the memory cell unit (first element region). In another step, a SiO$_2$ film was formed by thermal oxidation so as to have a thickness of 10 nm to 50 nm (100 angstroms to 500 angstroms) as a second gate insulating film 24b in the MOS transistor in the peripheral circuit unit (second element region). If the first gate insulating film 24a and the second gate insulating film 24b should have the same thickness, these oxide films may be simultaneously formed in one step.

Next, the peripheral circuit unit (the right view in FIG. 3) was masked by a resist film 26 to control a threshold voltage for the formation of a MOS transistor having n-type depletion type channels in the memory cell unit (the left and central views in FIG. 3). As an n-type dopant, phosphorus (P) or arsenic (As) was injected into a region to be a channel region directly below the floating gate electrode by ion implantation at a dose of $1 \times 10^{11}$ cm$^{-2}$ to $1 \times 10^{14}$ cm$^{-2}$ and thereby yielded a first threshold control layer 25a. The dose and conduction type of the dopant can be appropriately selected depending on whether the channel is a depletion type or an accumulation type.

Figure 4:
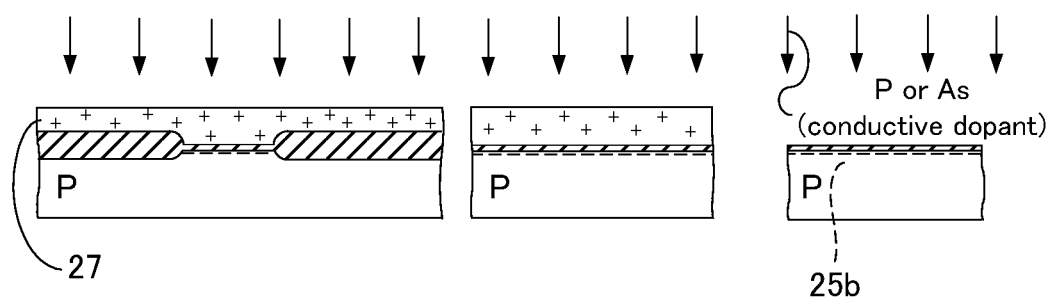
FIG. 4 is a schematic diagram explaining a first example of production of FLASH EPROM according to the method for producing a semiconductor device, and illustrates the following step of FIG. 3.

Next, the memory cell unit (the left and central views in FIG. 4) was masked by a resist film 27 to control a threshold voltage for the formation of a MOS transistor having n-type depletion type channels in the peripheral circuit unit (the right view in FIG. 4). As an n-type dopant, phosphorus (P) or arsenic (As) was injected into a region to be a channel region directly below the gate electrode by ion implantation at a dose of $1 \times 10^{11}$ cm$^{-2}$ to $1 \times 10^{14}$ cm$^{-2}$ and thereby yielded a second threshold control layer 25b.

Figure 5:
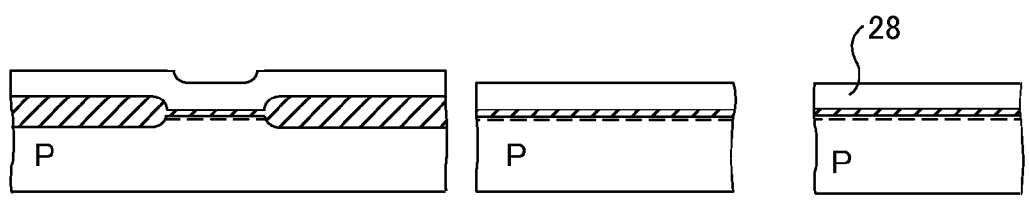
FIG. 5 is a schematic diagram explaining a first example of production of FLASH EPROM according to the method for producing a semiconductor device, and illustrates the following step of FIG. 4.

A first polysilicon film (first conductive film) 28 having a thickness of 50 nm to 200 nm (500 angstroms to 2,000 angstroms) was formed on the entire surface of the article as a floating gate electrode of the MOS transistor of the memory cell unit (the left and central views in FIG. 5) and as a gate electrode of the MOS transistor in the peripheral circuit unit (the right view in FIG. 5).

Figure 6:
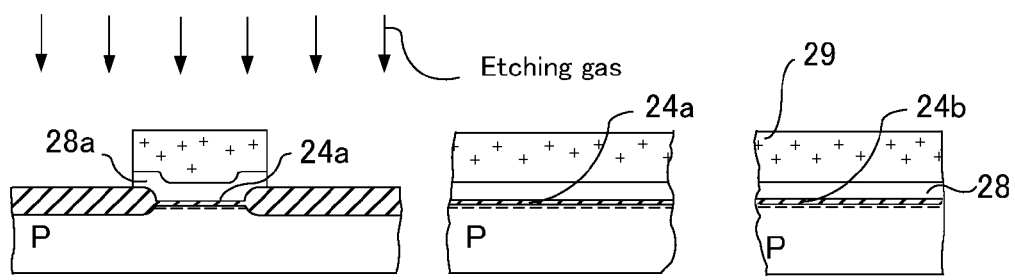
FIG. 6 is a schematic diagram explaining a first example of production of FLASH EPROM according to the method for producing a semiconductor device, and illustrates the following step of FIG. 5.

Thereafter, with reference to FIG. 6, a resist film 29 was formed, the first polysilicon film 28 was patterned using the resist film 29 as a mask and thereby yielded a floating gate electrode 28a in the MOS transistor in the memory cell unit (the left and central views in FIG. 6). In this procedure, as illustrated in FIG. 6, the first polysilicon film 28 was patterned in the X direction to be intended dimensions and was not patterned in the Y direction to thereby leave a region to be a source-drain (S/D) layer covered by the resist film 29.

Figure 7:
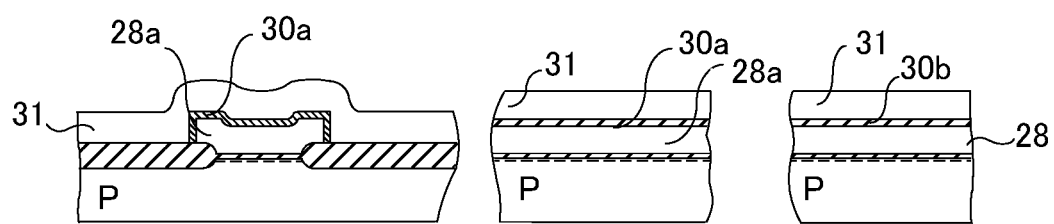
FIG. 7 is a schematic diagram explaining a first example of production of FLASH EPROM according to the method for producing a semiconductor device, and illustrates the following step of FIG. 6.

The resist film 29 was removed, a capacitor insulating film 30a made of a $SiO_2$ film was formed by thermal oxidation so as to cover the floating gate electrode 28a and to have a thickness of about 20 nm to about 50 nm (about 200 angstroms to about 500 angstroms) (the left and central views in FIG. 7). In this procedure, a capacitor insulating film 30b made of a $SiO_2$ film was also formed on the first polysilicon film 28 in the peripheral circuit unit (the right view in FIG. 7). These capacitor insulating films 30a and 30b are made of a $SiO_2$ film alone, however, they may include a multilayer film having two or three layers of $SiO_2$ film and $Si_3N_4$ film.

Next, a second polysilicon film (second conductive film) 31 was formed so as to have a thickness of 50 nm to 200 nm (500 angstroms to 2,000 angstroms) so as to cover the floating gate electrode 28a and the capacitor insulating film 30a, as illustrated in FIG. 7. The second polysilicon film 31 serves as a control gate electrode.

Figure 8:
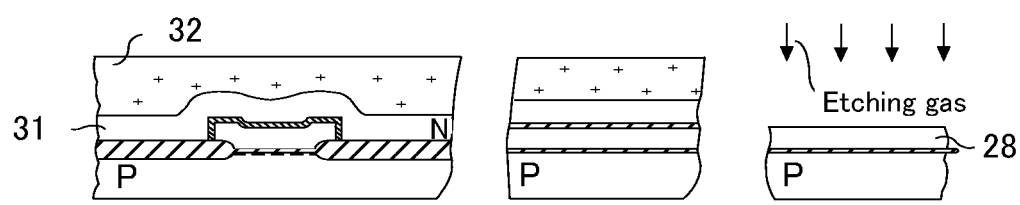
FIG. 8 is a schematic diagram explaining a first example of production of FLASH EPROM according to the method for producing a semiconductor device, and illustrates the following step of FIG. 7.

With reference to FIG. 8, the memory cell unit (the left and central views in FIG. 8) was masked by a resist film 32, the second polysilicon film 31 and the capacitor insulating film 30b in the peripheral circuit unit (the right view in FIG. 8) were removed in turn by etching to thereby expose the first polysilicon film 28 from the surface.

Figure 9:
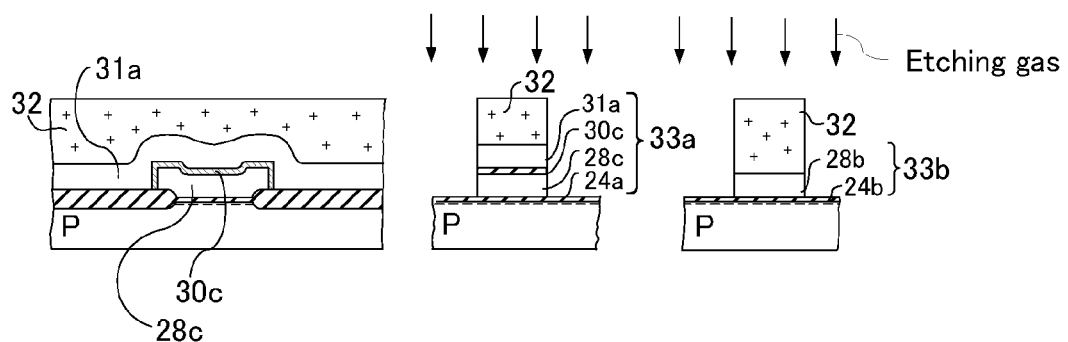
FIG. 9 is a schematic diagram explaining a first example of production of FLASH EPROM according to the method for producing a semiconductor device, and illustrates the following step of FIG. 8.
Figure 10:
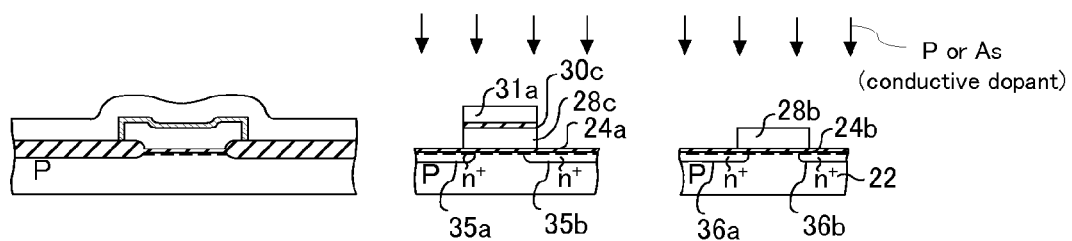
FIG. 10 is a schematic diagram explaining a first example of production of FLASH EPROM according to the method for producing a semiconductor device, and illustrates the following step of FIG. 9.

With reference to FIG. 9, the second polysilicon film 31, the capacitor insulating film 30a, and the first polysilicon film 28a of the memory cell unit (the left and central views in FIG. 9), which first polysilicon film 28a had been patterned only in the X direction, were patterned in the Y direction to target dimensions of a first gate unit 33a using the resist film 32 as a mask. Thus, a multilayer assemblage of a control gate electrode 31a, a capacitor insulating film 30c, and a floating gate electrode 28c having a width of about 1 µm in the Y direction was formed. In addition, the first polysilicon film 28 in the peripheral circuit unit (the right view in FIG. 9) was patterned to target dimensions of a second gate unit 33b and thereby yielded a gate electrode 28b about 1 µm wide.

Phosphorus (P) or arsenic (As) was injected into the element forming region of the Si substrate 22 by ion implantation at a dose of $1 \times 10^{14}$ cm$^{-2}$ to $1 \times 10^{16}$ cm$^{-2}$ using, as a mask, the multilayer assemblage of the control gate electrode 31a, the capacitor insulating film 30c, and the floating gate electrode 28c in the memory cell unit (the left and central views in FIG. 10) and thereby yielded n-type source and drain (S/D) region layers 35a and 35b. In addition, phosphorus (P) or arsenic (As) as an n-type dopant was injected into the element forming region of the Si substrate 22 by ion implantation at a dose of $1 \times 10^{14}$ cm$^{-2}$ to $1 \times 10^{16}$ cm$^{-2}$ using the gate electrode 28b in the peripheral circuit unit (the right view in FIG. 10) as a mask and thereby yielded S/D region layers 36a and 36b.

Figure 11:
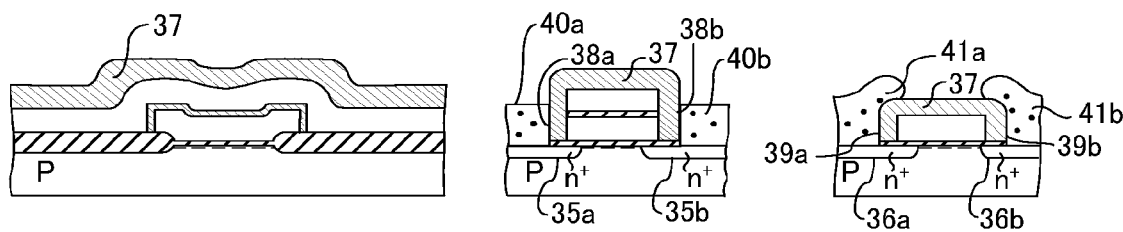
FIG. 11 is a schematic diagram explaining a first example of production of FLASH EPROM according to the method for producing a semiconductor device, and illustrates the following step of FIG. 10.

A phosphate-silicate glass film (PSG film) about 500 nm (5,000 angstroms) thick was formed as an interlayer insulating film 37 so as to cover the first gate unit 33a in the memory cell unit (the left and central views in FIG. 11) and the second gate unit 33b in the peripheral circuit unit (the right view in FIG. 11).

Subsequently, contact holes 38a, 38b, 39a, and 39b were formed in the interlayer insulating film 37 on the S/D region layers 35a, 35b, 36a, and 36b, respectively. S/D electrodes 40a, 40b, 41a and 41b were then formed respectively As has been mentioned above, FLASH EPRON was formed as a semiconductor device as illustrated in FIG. 11.

In the above-produced FLASH EPROM, the second gate insulating film 24b in the peripheral circuit unit (the right views in FIGS. 3 through 11) remains being covered by the first polysilicon film 28 or the gate electrode 28b after its formation (the right views in FIGS. 3 through 11) and thereby keeps its initial thickness. Accordingly, the thickness of the second gate insulating film 24b can be easily controlled, and the concentration of a conductive dopant can be easily controlled for the control of the threshold voltage.

In this embodiment, the first gate unit 33a is formed by initially patterning in the gate width direction (the X direction in FIGS. 1 and 2) to a set width and then patterning in the gate length direction (the Y direction in FIGS. 1 and 2) to a target width. Alternatively, the first gate unit 33a may be formed by initially patterning in the gate length direction (the Y direction in FIGS. 1 and 2) to a set width and then patterning in the gate width direction (the X direction in FIGS. 1 and 2) to a target width.

Figure 12:
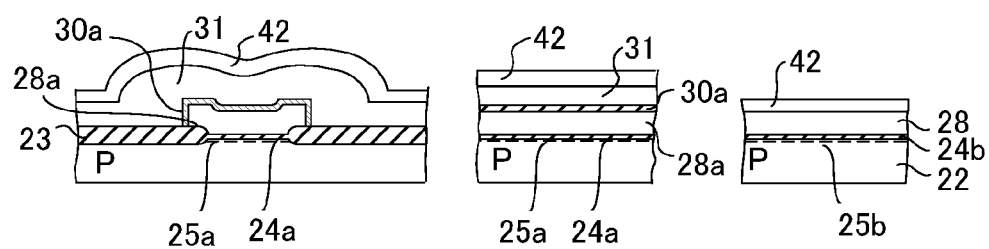
FIG. 12 is a schematic diagram explaining a second example of production of FLASH EPROM according to the method for producing a semiconductor device.
Figure 13:
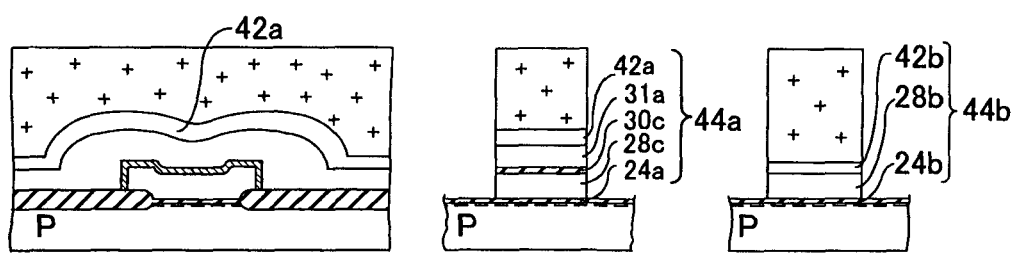
FIG. 13 is a schematic diagram explaining a second example of production of FLASH EPROM according to the method for producing a semiconductor device, and illustrates the following step of FIG. 12.
Figure 14:
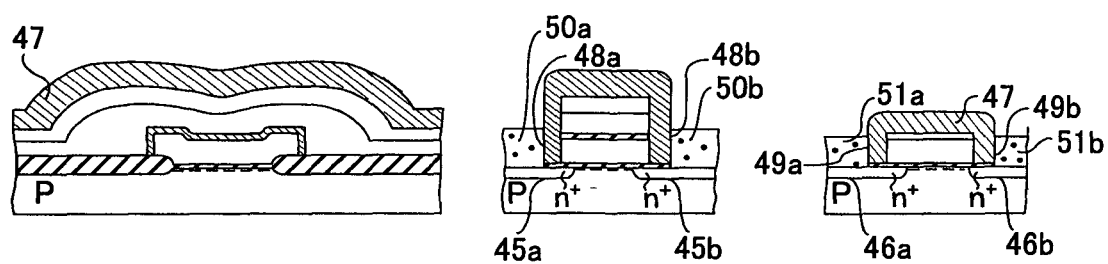
FIG. 14 is a schematic diagram explaining a second example of production of FLASH EPROM according to the method for producing a semiconductor device, and illustrates the following step of FIG. 13.

A production example of FLASH EPROM illustrated in FIGS. 12 to 14 was the same as Example 11, except that the steps subsequent to the step of FIG. 7 were changed to those illustrated in FIGS. 12 to 14. Specifically, as illustrated in FIG. 12, a tungsten (W) film or a titanium (Ti) film having a thickness of about 200 nm (2,000 angstroms) was formed as a high-melting point metal film (fourth conductive film) 42 on the second polysilicon film 31 in the memory cell unit (the left and central views in FIG. 12) and the first polysilicon film 28 in the peripheral circuit unit (the right view in FIG. 12) and thereby yielded a polycide film. The steps of FIGS. 13 and 14 subsequent to the step of FIG. 12 were carried out in the same manner as in FIGS. 9 to 11 and a detail description thereof is omitted. The same components in FIGS. 12 to 14 as in FIGS. 9 to 11 have the same reference numerals.

Thus, a FLASH EPROM as a semiconductor device was produced as illustrated in FIG. 14.

Note that, in FIG. 13, 44a and 44b represent a first gate unit and a second unit gate, respectively. In addition, in FIG. 14, 45a, 45b, 46a, and 46b represent source and drain (S/D) region layers, 47 represents an interlayer insulating film, 48a, 48b, 49a, and 49b represent contact holes, and 50a, 50b, 51a, and 51b represent source and drain (S/D) electrodes.

The above-produced FLASH EPROM has the high-melting point metal films (fourth conductive films) 42a and 42b on the control gate electrode 31a and the gate electrode 28b and can thereby further reduce its electrical resistance.

In this embodiment, the high-melting point metal films (fourth conductive films) 42a and 42b are used as the high-melting point metal films (fourth conductive films). Alternatively, high-melting point metal silicide films such as titanium silicide (TiSi) films can be used.

Figure 15:
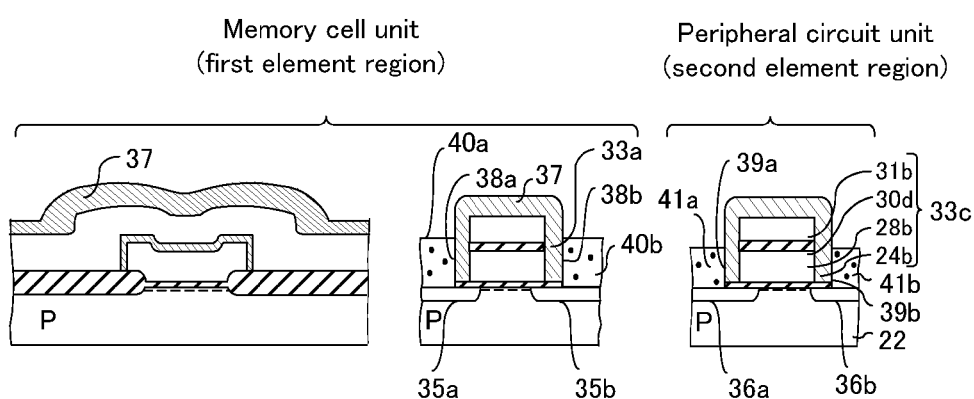
FIG. 15 is a schematic diagram explaining a third example of production of FLASH EPROM according to the method for producing a semiconductor device.
Figure 16:
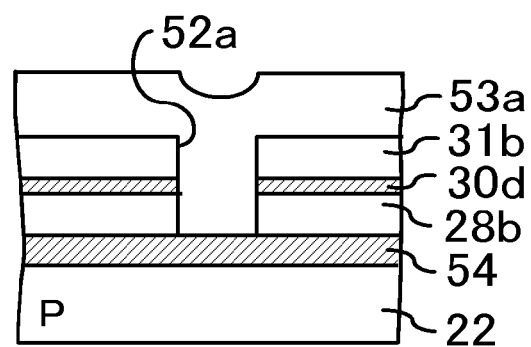
FIG. 16 is a schematic diagram explaining a third example of production of FLASH EPROM according to the method for producing a semiconductor device, and illustrates the following step of FIG. 15.
Figure 17:
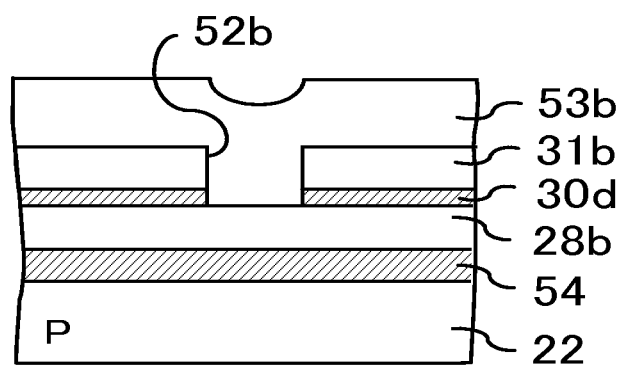
FIG. 17 is a schematic diagram explaining a third example of production of FLASH EPROM according to the method for producing a semiconductor device, and illustrates the following step of FIG. 16.

A production example of FLASH EPROM illustrated in FIGS. 15 to 17 was the same as Example 11, provided that a second gate unit 33c in the peripheral circuit unit (second element region) (the right view in FIG. 15) had a multilayer structure equipped with a first polysilicon film (first conductive film) 28b, a $SiO_2$ film (capacitor insulating film) 30d, and a second polysilicon film (second conductive film) 31b arranged in this order as in the first gate unit 33a in the memory cell unit (the left and central views in FIG. 15), and the first polysilicon film 28b and the second polysilicon film 31b were short-circuited and thereby form a gate electrode as illustrated in FIG. 16 or 17.

Here, as illustrated in FIG. 16, the first polysilicon film 28b and the second polysilicon film 31b are short-circuited by forming an opening 52a penetrating the first polysilicon film (first conductive film) 28b, the SiO$_2$ film (capacitor insulating film) 30d and the second polysilicon film (second conductive film) 31b at other portion than the second gate unit 33c illustrated in FIG. 15, for example, on the insulating film 54, and filling the opening 52a with a high-melting point metal film (third conductive film) 53a such as a W film or a Ti film. Moreover, as illustrated in FIG. 17, the first polysilicon film 28b and the second polysilicon film 31b may be short-circuited by forming an opening 52b penetrating the SiO$_2$ film (capacitor insulating film) 30d and the second polysilicon film (second conductive film) 31b, thereby exposing the lower first polysilicon film 28b at the bottom of the opening 52b, and filling the opening 52b with a third conductive film, e.g. a high-melting point metal film 53b such as a W film or a Ti film.

In the above-produced FLASH EPROM, the second gate unit 33c in the peripheral circuit unit has the same structure as the first gate unit 33a in the memory cell unit. Accordingly, the memory cell unit and the peripheral circuit unit can be formed by the same step to thereby efficiently simplify steps of the production process.

In this embodiment, the third conductive film 53a or 53b and the high-melting point metal film (fourth conductive film) 42 were formed separately. Alternatively, these films may be formed simultaneously as a high-melting point metal film in common.

Example 12

—Production of Magnetic Head—

Example 12 is production of a magnetic head as an applied example of a resist pattern formed in a resist film formed using the method for forming a conductive antireflection film of the invention as the base. Note that, in Example 12, the following resist pattern/R2A was a resist pattern formed by exposing the resist film to electron beam in a resist film, which was formed using the resist compositions of Examples 1 to 10, using the material for forming a conductive antireflection film of the invention.

The production process of a thin film magnetic head using the material for forming a fine pattern and method for forming a fine pattern of the invention will be explained with reference to FIGS. 18 to 24.

Figure 18:
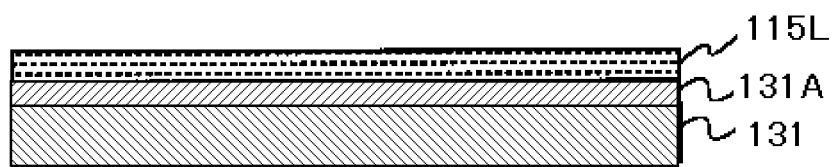
FIG. 18 is a cross-sectional schematic diagram explaining an example of production of a magnetic head applying a resist pattern of a resist film formed on a conductive antireflection film formed using the material forming a conductive antireflection film.

With reference to FIG. 18, a lower magnetic shield layer 131 formed of NiFe alloy was formed on an Al$_2$O$_3$-TiC substrate (omitted from FIG. 18) via an Al$_2$O$_3$ film (omitted from FIG. 18) by electroplating, and a spin bulb structured film 115L was formed thereon via a gap spacer layer 131A of Al$_2$O$_3$ by sputtering.

Figure 19:
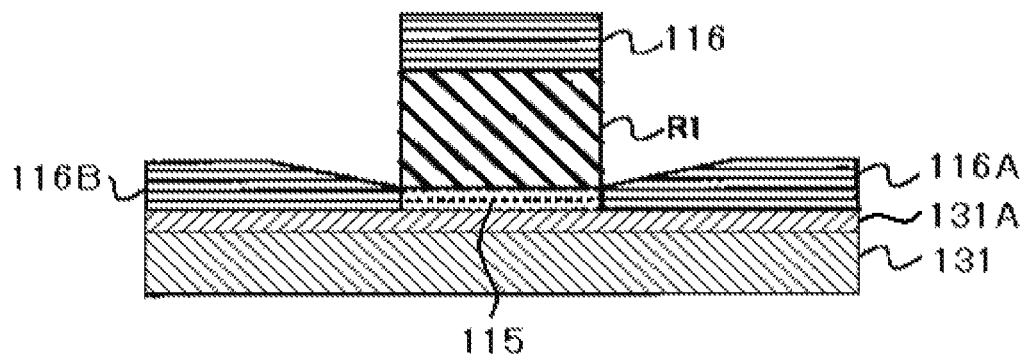
FIG. 19 is a cross-sectional schematic diagram explaining an example of production of a magnetic head applying a resist pattern of a resist film formed on a conductive antireflection film formed using the material forming a conductive antireflection film, and illustrates the following step of FIG. 18.

Next, in the step illustrated in FIG. 19, the spin bulb structured film 115L was patterned to have a predetermined shape, e.g. a width of 300 nm, using a resist pattern R1 as a mask, to thereby form a magnetoresistance effect element 115. In addition, in the step of FIG. 19, a hard bias film 116 formed of CoCrPt was formed by sputtering using the resist pattern R1 as a mask, and hard bias patterns 116A and 116B were formed on the both sides of the magnetoresistance effect element 115.

Figure 20:
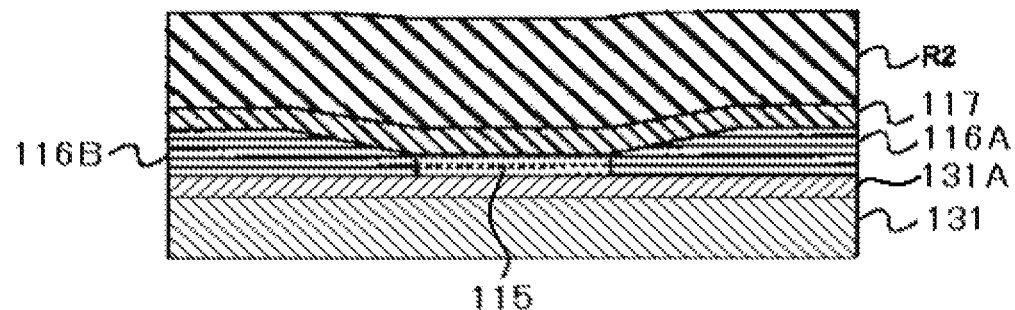
FIG. 20 is a cross-sectional schematic diagram explaining an example of production of a magnetic head applying a resist pattern of a resist film formed on a conductive antireflection film formed using the material forming a conductive antireflection film, and illustrates the following step of FIG. 19.

In the step illustrated in FIG. 20, the resist pattern R1 was removed along with the CoCrPt film 116 accumulated on the top of the resist pattern R1, and an organic polymer film 117 was formed on an entire surface of the magnetoresistance effect element 115 so as to also cover the hard bias patterns 116A and 116B present on the both sides of the magnetoresistance effect element 115.

Figure 21:
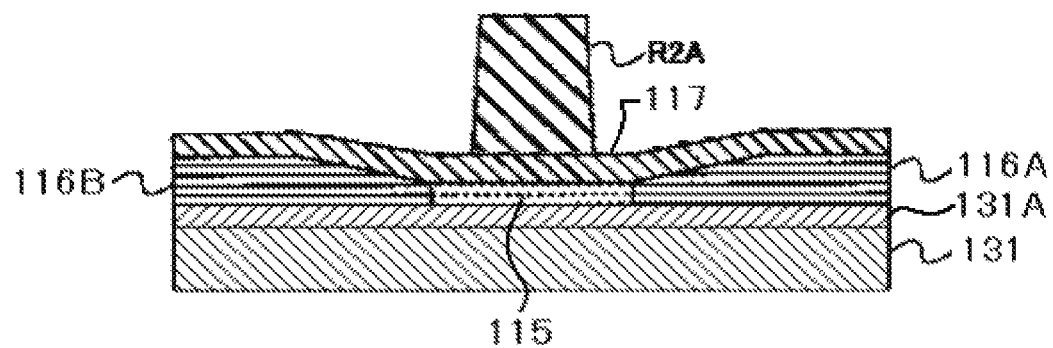
FIG. 21 is a cross-sectional schematic diagram explaining an example of production of a magnetic head applying a resist pattern of a resist film formed on a conductive antireflection film formed using the material forming a conductive antireflection film, and illustrates the following step of FIG. 20.

In addition, in the step of FIG. 20, a resist film R2 was applied on the organic polymer film 117 so as to have a thickness of, for example, 500 nm, using a commercially available KrF resist, for example, UV-6 manufactured by Shipley In the step illustrated in FIG. 21, using an electron beam having an acceleration voltage of 50 KeV and KrF excimer laser having a wavelength of 248 nm as exposure light sources, a region including the magnetoresistance effect element was exposed to the electron beam and the other area having a large exposure area was exposed to KrF excimer laser, followed by developing with a TMAH solution.

As a result, a resist pattern R2A was formed so as to have a width of, for example, 150 nm.

Figure 22:
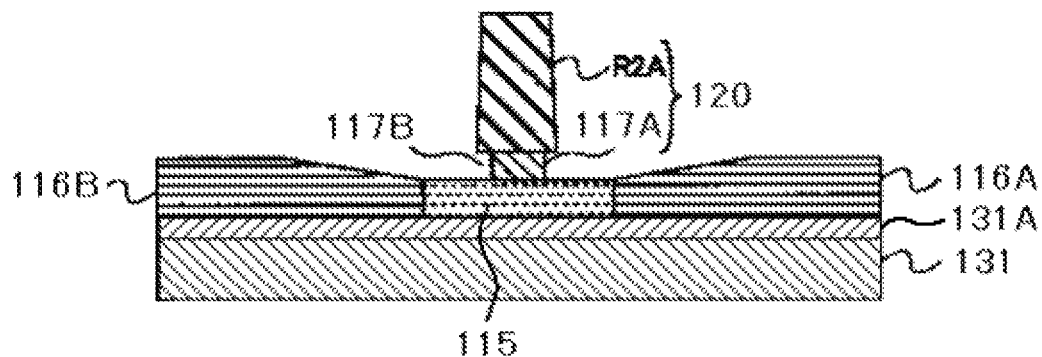
FIG. 22 is a cross-sectional schematic diagram explaining an example of production of a magnetic head applying a resist pattern of a resist film formed on a conductive antireflection film formed using the material forming a conductive antireflection film, and illustrates the following step of FIG. 21.

In the step illustrated in FIG. 22, a sliming processing was performed to thereby form a lift-off mask pattern 120 formed of the resist pattern R2A and the organic polymer film 117A on the magnetoresistance effect element 115.

At the time of the sliming processing of FIG. 22, the etching rate ratio of the resist pattern R2A to the organic polymer film pattern 117A was 1/1.3, and as a result, undercut 117B was formed.

When the resist pattern R2A had a width of 100 nm and the organic polymer film pattern 117A had a width of 90 nm, undercuts 117B each having a width of about 5 nm were formed at the both sides of the pattern 117A.

Figure 23:
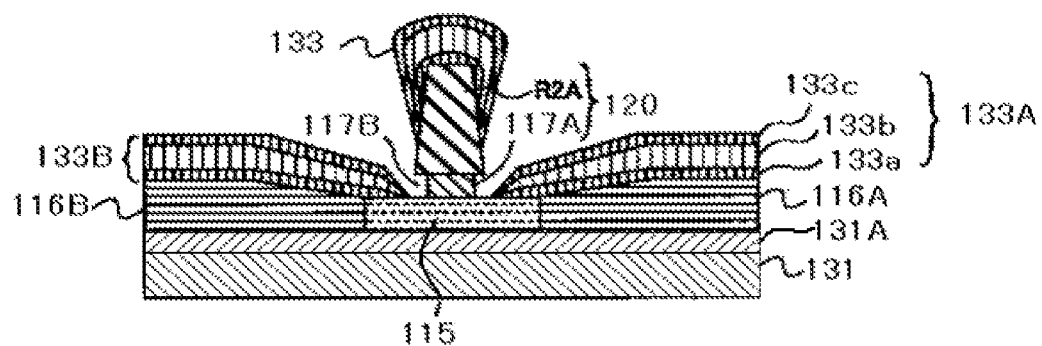
FIG. 23 is a cross-sectional schematic diagram explaining an example of production of a magnetic head applying a resist pattern of a resist film formed on a conductive antireflection film formed using the material forming a conductive antireflection film, and illustrates the following step of FIG. 22.

In the step illustrated in FIG. 23, Ta film 133a, Au film 133b and Ta film 133c were successively accumulated in the thickness of 2 nm, 20 nm, and 2 nm, respectively, using as a mask the lift-off pattern 120 consisting of the organic polymer film pattern 117A and the resist pattern R2A, to thereby accumulate a readout electrode layer 133 having a laminate structure of Ta/Au/Ta. Along with the accumulation of the readout electrode layer 133, readout electrode patterns 133A and 133B each having the Ta/Au/Ta laminate structure were formed on the hard bias patterns 116A and 116B, and at both sides of the lift-off pattern 120.

Figure 24:
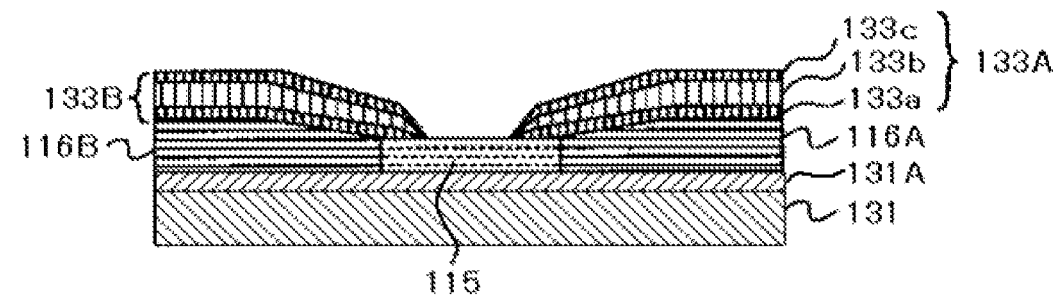
FIG. 24 is a cross-sectional schematic diagram explaining an example of production of a magnetic head applying a resist pattern of a resist film formed on a conductive antireflection film formed using the material forming a conductive antireflection film, and illustrates the following step of FIG. 23.

In the step illustrated in FIG. 24, the resist pattern R2A was removed with acetone, and at the same time the electrode layer 133 accumulated on the resist pattern R2A was removed. Moreover, the organic polymer film pattern 117A was removed with N-methyl pyrrolidone (NMP).

As a sequential step to the step mentioned above, NiFe alloy layer 134 (see FIG. 25) constituting an upper magnetic shield layer and a lower magnetic pole layer was formed via a gap spacer layer formed of Al$_2$O$_3$ by electroplating, and a writing gap layer formed of Al$_2$O$_3$ was further formed as in the conventional art.

Figure 25:
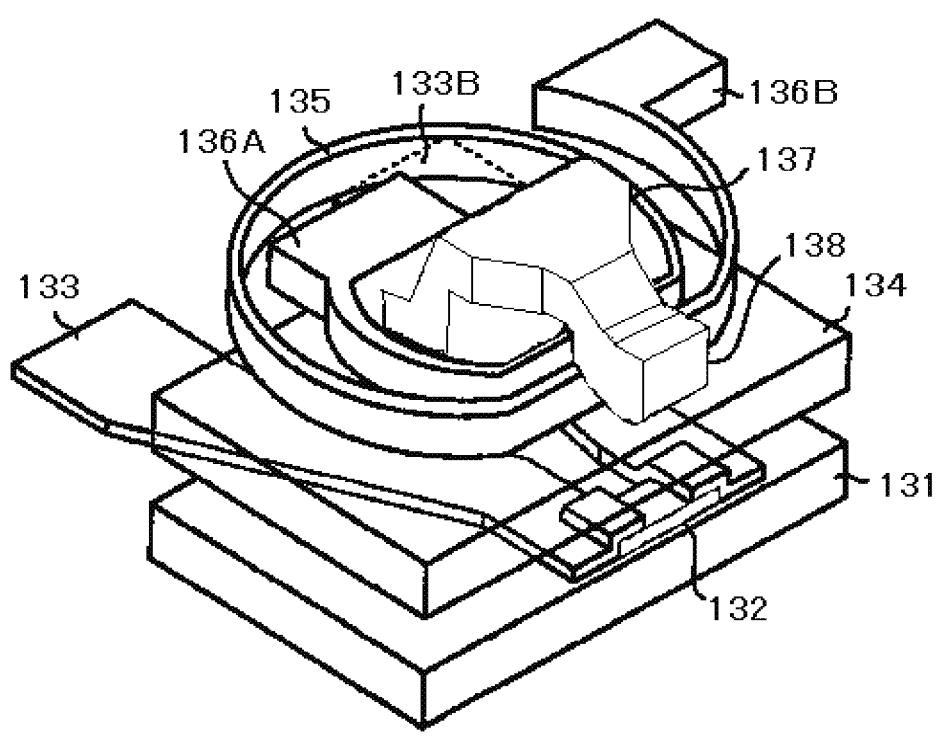
FIG. 25 is a projective view illustrating an example of a magnetic head produced through the steps of FIGS. 18 to 24.

Next, a first interlayer insulating film formed of a resist film was formed, and Cu layer was formed in the form of a horizontal spiral pattern on the first interlayer insulating film by electroplating, to thereby form a writing coil 135 illustrated in FIG. 25. Moreover, writing electrodes 136A and 136B were respectively disposed at both sides of the wiring coil, a resist film was formed so as to cover the writing coil to thereby form a second interlayer insulating film.

Furthermore, a plating base layer formed of a Ti film was formed on an entire surface of the second interlayer insulating film, and a NiFe film was selectively electroplated on the second interlayer insulating film using a resist mask formed on the plating base layer as a plating frame, to thereby form an upper magnetic pole layer 137 and an edge wiring magnetic pole 138.

Thereafter, the resist mask was removed, the exposed portion of the plating base layer was removed by ion milling using Ar ions, and an Al$_2$O$_3$ protective film was formed on the entire surface thereof. Thereafter, the substrate was cut to thereby obtain a magnetic head slider in which a readout heat including the magnetoresistance effect element 115 and an induction type thin film magnetic head for writing were integrated.

Note that, in FIG. 25, 132 represents a magnetoresistane effect element.

As has been explained above, the present embodiment enables to produce a magnetic resistance sensor having a fine core width with a simple process, high accuracy and excellent yield, by using a conductive resist.

All examples and conditional language recited herein are intended for pedagogical purposes to aid the render in understanding the invention and the concepts contributed by the inventor to furthering the art, and are to be construed as being without limitation to such specifically recited examples and conditions, nor does the organization of such examples in the specification related to a showing of the superiority and inferiority of the invention. Although the embodiment(s) of the present inventions have been described in detail, it should be understood that the various changes, substitutions, and alterations could be made hereto without departing from the spirit and scope of the invention.

The material for forming a conductive antireflection film of the invention contains a base resin having conductivity, a crosslinking agent, a thermal acid generator, and a solvent, has a wide selection of usable materials, and has an excellent antistatic effect and high sensitivity. Even in the case where an electron beam is used for exposure, the material for forming a conductive antireflection film can be suitably used for the formation of a fine resist pattern at high resolution without omission or dislocation of the resist pattern. Moreover, the material for forming a conductive antireflection film is suitably applied for various patterning method and production methods of a semiconductor, and is especially suitably used for a conductive antireflection film, a method for forming a resist pattern, a semiconductor device, and a magnetic head of the invention.

The method for forming a resist pattern of the invention is suitably applied for the productions of functional parts such as a mask pattern, reticle pattern, magnetic head, liquid crystal display (LCD), plasma display panel (PDP), and surface acoustic wave filter (SAW filter), optical parts used for connecting optical wirings, fine parts such as micro actuator, and an electronic device such as a semiconductor device, and is suitably used for the method for producing an electronic device of the invention The semiconductor device of the invention is suitably used as various semiconductor devices including a flash memory, DRAM, and FRAM.

What is claimed is:

1. A material for forming a conductive antireflection film, comprising:
    a base resin having conductivity;
    a crosslinking agent;
    a thermal acid generator; and
    a solvent,
    wherein the thermal acid generator is at least any one selected from the group consisting of methyl naphthalenesulfonate, benzyl-3-methoxycarbonylbenzenesulfonate, 2-nitroethyl benzenesulfonate, 3-acetoaminopropyl-p-toluenesulfonate, diethyl sulfate, di-n-propyl sulfate, di-n-butyl sulfate, bis(2-ethylhexyl) sulfate, dilauryl sulfate, distearyl sulfate, bis(2-phenethyl)sulfate, bis($\alpha$-naphthylmethyl)sulfate, dibenzyl sulfate, bis(2-butoxyethyl)sulfate, bis(2-phenoxyethyl)sulfate, bis(2-octylthioethyl) sulfate, bis[2-(4-tolyl)thioethyl]sulfate, bis(4-nitroethyl)sulfate, bis(2-chloroethyl)sulfate, dicyclohexyl sulfate, bis(4-methylcyclohexyl)sulfate, bis(4-methoxycyclohexyl) sulfate, bis(4-butylthiocyclohexyl)sulfate, 2-nitrobenzyl tosylate, 4-nitrobenzyl tosylate, 1-trifluoromethyl-6-nitrobenzyl-4-chlorobenzene sulfonate, 2-trifluoromethyl-6-nitrobenzyl-4-nitrobenzene sulfonate, and 2-butynyl tetramethylene sulfonium hexafluoroantimonate, and
    wherein the base resin comprises at least one selected from the group consisting of an aniline-2-methoxy-5-propyloxy-3-sulfonate polymer and a 3-amino-4-methoxybenzene sulfonate/3-amino-4-methylbenzene sulfonate (60/40) copolymer.

2. The material according to claim 1, wherein the base resin comprises at least one selected from the group consisting of polyaniline, polyparaphenyl vinylene, polythiophene, polypyrrole, poly-p-phenylene oxide, polyfuran, polyphenylene, polyazine, polyselenophene, polyphenylene sulfide, and polyacetylene.

3. The material according to claim 1, wherein the crosslinking agent is at least one selected from the group consisting of a melamine derivative, a urea derivative, and an uril derivative.

4. The material according to claim 1, wherein an amount of the thermal acid generator is 0.5% by mass to 40% by mass with respect to the base resin.

5. The material according to claim 1, wherein the solvent is at least one selected from the group consisting of glycol ether ester, glycol ether, ester, ketone, cyclic ester, alcohol and water.

6. The material according to claim 1, further comprising an ultraviolet absorbent.

* * * * *